(12) United States Patent
Takekuma et al.

(10) Patent No.: US 7,485,188 B2
(45) Date of Patent: Feb. 3, 2009

(54) COATING PROCESS METHOD AND COATING PROCESS APPARATUS

(75) Inventors: Takashi Takekuma, Kumamoto (JP); Yasuyuki Kometani, Kumamoto (JP); Yoshiteru Fukuda, Kumamoto (JP); Junya Minamida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 222 days.

(21) Appl. No.: 11/362,105

(22) Filed: Feb. 27, 2006

(65) Prior Publication Data

US 2006/0144330 A1 Jul. 6, 2006

Related U.S. Application Data

(62) Division of application No. 10/384,629, filed on Mar. 11, 2003, now abandoned.

(30) Foreign Application Priority Data

Mar. 19, 2002 (JP) .............................. 2002-76418

(51) Int. Cl.
B05C 11/10 (2006.01)
(52) U.S. Cl. .................... 118/683; 118/684; 118/699; 118/702; 118/712; 118/713
(58) Field of Classification Search ................ 118/683, 118/684, 699, 702, 703, 712, 713
See application file for complete search history.

(56) References Cited

U.S. PATENT DOCUMENTS

| | | | |
|---|---|---|---|
| 5,035,200 A | 7/1991 | Moriyama et al. | |
| 5,843,527 A | 12/1998 | Sanada | |
| 5,938,847 A | 8/1999 | Akimoto et al. | |
| 5,985,357 A | 11/1999 | Sanada | |
| 6,056,998 A | 5/2000 | Fujimoto | |
| 6,130,682 A | 10/2000 | Kohno et al. | |
| 6,165,270 A | 12/2000 | Konishi et al. | |
| 6,238,109 B1 | 5/2001 | Minami | |
| 6,391,111 B1 | 5/2002 | Fujimoto et al. | |
| 6,632,283 B1 | 10/2003 | Singh et al. | |
| 6,635,113 B2 | 10/2003 | Takamori et al. | |
| 6,680,078 B2 | 1/2004 | Davlin et al. | |
| 6,769,756 B2 | 8/2004 | Su et al. | |

*Primary Examiner*—George R Koch, III
(74) *Attorney, Agent, or Firm*—Rader, Fishman & Grauer, PLLC

(57) ABSTRACT

A coating process method in which a coating liquid is discharged onto the surface of a target substrate to be processed while rotating the target substrate so as to expand the coating liquid radially outward on the target substrate and, thus, to form a coated film comprises the step of detecting that the actual discharging of a coating liquid from a coating liquid discharging nozzle is started, and the step of controlling based on a signal of the detection at least one of the driving timing of a pump for allowing the coating liquid to be discharged from the coating liquid discharging nozzle, the operation timing of a valve mounted to a pipe for supplying the coating liquid into the coating liquid discharging nozzle, and the rotation starting or stopping timing of the target substrate.

20 Claims, 14 Drawing Sheets

COATING PROCESS METHOD AND COATING PROCESS APPARATUS

CROSS REFERENCE TO RELATED APPLICATIONS

The present application is a Divisional application of the patent application Ser. No. 10/384,629, filed on Mar. 11, 2002, now abandoned, which is based on Priority Document JP-2002-76418 filed on Mar. 19, 2002 the entire contents of which are incorperated herein by reference.

BACKGROUND OF THE INVENTION

1. Field of the Invention

The present invention relates to a coating process method and a coating process apparatus, in which a substrate such as a semiconductor wafer is coated with a liquid coating material such as a resist.

2. Description of the Related Art

In the manufacturing process of a semiconductor device, a resist pattern that is used as a mask for forming a prescribed pattern is formed by means of a so-called "photolithography technology", in which a resist solution is supplied onto a semiconductor wafer so as to form a resist film, followed by applying a light exposure treatment in a prescribed pattern to the wafer after the resist coating step and subsequently developing the light-exposed pattern formed on the resist film on the wafer. In the resist coating process among the manufacturing steps noted above, a spin coating method is employed in many cases as a method for uniformly coating the wafer surface with the resist solution.

In the spin coating method, a resist solution is dripped from a resist nozzle arranged above the wafer W onto the central portion of the wafer surface while rotating the wafer W together with a spin chuck by a rotary driving mechanism, with the wafer W held stationary on the spin chuck by means of vacuum suction. The dripped resist solution is centrifugally expanded radially outward on the wafer surface so as to form a resist film on the entire surface of the wafer W. Then, the dripping of the resist solution is stopped, and the rotation of the wafer W is continued so as to centrifugally remove the extra resist solution on the wafer surface, thereby controlling the thickness of the resist film and drying the resist film.

In order to form a resist pattern with a high precision, it is necessary to form the resist film in a prescribed uniform thickness over the entire surface of the wafer W. Also, for forming the resist film in a uniform thickness over the entire surface of the wafer W, it is important to control strictly the resist solution dripping time, and the timing of the resist solution dripping and the wafer rotation in addition to the rotating speed and the rotating time of the wafer W.

It was customary in the past to supervise the thickness and the thickness distribution of the resist film by controlling the coating device, etc. with a software.

However, in the conventional resist solution supply mechanism, resist discharging nozzles of a plurality of resist coating process units are connected to a single resist solution discharging pump, with the result that, because of the installing conditions such as the difference in head, the discharging timing of the resist solution tends to be rendered nonuniform depending on the resist solution discharging nozzle used even if the resist solution is discharged on the basis of the same recipe. The discharging timing of the resist solution is also rendered nonuniform by the individual variation of the air operation valve used as an opening-closing valve of the resist solution supply pipe or the resist solution discharging pump.

Such a nonuniformity in the discharging time was not handled as a serious problem in the past. However, a prominent progress is being achieved in recent years in the miniaturization of the semiconductor device and in the enlargement in the diameter of the semiconductor substrate to be process. In this connection, very high levels of the demands for the accuracy in the thickness of the resist film and for the uniformity of the resist film thickness are being raised nowadays. It follows that even the nonuniformity in the discharging timing of the resist solution caused by the difference in head and by the individual variation has come to affect seriously the thickness and the uniformity of the thickness of the resist film. It should also be noted that the reduction in the discharging amount of the resist solution (resist saving) is being promoted in recent years so as to affect the change in the discharging amount and the change in the discharging rate of the resist solution.

BRIEF SUMMARY OF THE INVENTION

An object of the present invention is to provide a coating process method and a coating process apparatus, which permit forming a coated film such as a resist film with a high accuracy and a high uniformity in the film thickness.

According to a first aspect of the present invention, there is provided a coating process method in which a coating liquid is discharged onto the surface of a target substrate to be processed while rotating the target substrate so as to expand the coating liquid radially outward on the target substrate and, thus, to form a coated film, comprising the steps of detecting that the actual discharging of a coating liquid from a coating liquid discharging nozzle is started and/or stopped; and controlling the coating treatment on the basis of a signal of the detection.

According to a second aspect of the present invention, there is provided a coating process method in which a coating liquid is discharged onto the surface of a target substrate to be processed while rotating the target substrate so as to expand the coating liquid radially outward on the target substrate and, thus, to form a coated film, comprising the steps of detecting that the actual discharging of a coating liquid from a coating liquid discharging nozzle is started; and controlling based on a signal of the detection at least one of the drive timing of a pump for allowing the coating liquid to be discharged from the coating liquid discharging nozzle, the operation timing of a valve mounted to a pipe for supplying the coating liquid into the coating liquid discharging nozzle, and the rotation starting or stopping timing of the target substrate.

According to a third aspect of the present invention, there is provided a coating process method in which a coating liquid is discharged onto the surface of a target substrate to be processed while rotating the target substrate so as to expand the coating liquid radially outward on the target substrate and, thus, to form a coated film, comprising the steps of detecting that the actual discharging of a coating liquid from a coating liquid discharging nozzle is stopped; and controlling based on a signal of detection at least one of the drive stop timing of a pump for allowing the coating liquid to be discharged from the coating liquid discharging nozzle, the operation timing of a valve mounted to a pipe for supplying the coating liquid into the coating liquid discharging nozzle, and the rotation stop timing of the target substrate.

According to a fourth aspect of the present invention, there is provided a coating process apparatus in which a coating liquid is discharged onto the surface of a target substrate to be processed while rotating the target substrate so as to expand the coating liquid radially outward on the target substrate and, thus, to form a coated film, comprising a substrate holding member for holding substantially horizontal a target substrate to be processed; a motor for rotating the substrate holding member; a coating liquid discharging nozzle for discharging a coating liquid onto the target substrate held by the substrate holding member; a pump for allowing the coating liquid to be discharged from the coating liquid discharging nozzle; a valve mounted to a pipe for supplying the coating liquid into the coating liquid discharging nozzle; a detecting device optically detecting that the discharging of the coating liquid from the coating liquid discharging nozzle has been started; and a controller receiving a signal of the detection from the detecting device so as to control based on the detection signal at least one of the drive timing of the pump for allowing the coating liquid to be discharged from the coating liquid discharging nozzle, the operation timing of the valve, and the drive starting or stopping timing of the motor.

According to a fifth aspect of the present invention, there is provided a coating process apparatus in which a coating liquid is discharged onto the surface of a target substrate to be processed while rotating the target substrate so as to expand the coating liquid radially outward on the target substrate and, thus, to form a coated film, comprising a substrate holding member for holding substantially horizontal a target substrate to be processed; a motor for rotating the substrate holding member; a coating liquid discharging nozzle for discharging a coating liquid onto the target substrate held by the substrate holding member; a pump for allowing the coating liquid to be discharged from the coating liquid discharging nozzle; a valve mounted to a pipe for supplying the coating liquid into the coating liquid discharging nozzle; a detecting device for optically detecting that the discharging of the coating liquid from the coating liquid discharging nozzle has been finished; and a controller receiving a signal of the detection from the detecting device so as to control based on the detected signal at least one of the drive stop timing of the pump for allowing the coating liquid to cease to be discharged from the coating liquid discharging nozzle, the operation timing of the valve, and the stop timing of the motor.

According to the first aspect of the present invention, a signal denoting that the discharging of the coating liquid from the coating liquid discharging nozzle has been actually started and/or stopped is detected, and the coating treatment is controlled on the basis of the detected signal. It follows it is possible to control the various conditions on the basis that the time when the coating liquid has been actually discharged is grasped so as to make it possible to form a coated film such as a resist film with a high accuracy in the film thickness and with a high uniformity in the film thickness.

To be more specific, in the conventional control based on a software, an "open" signal, i.e., a signal to open the valve, is simply transmitted to the valve mounted to the nozzle in allowing a coating liquid such as a resist solution to be discharged. However, the time between the actual transmission of the "open" signal to the valve and the actual discharging of the resist solution tends to be rendered nonuniform by the difference in the head of the resist solution supply nozzle and by the individual variation of the pump or the valve, with the result that it is possible for the actual discharging of the coating liquid to be deviated from the predetermined discharging timing of the coating liquid. Under the circumstances, the discharging timing of the coating liquid is controlled with a high accuracy in the present invention by detecting the actual starting and/or stopping in the discharging of the coating liquid so as to make it possible to form a coated film with a high accuracy in the film thickness and with a high uniformity in the thickness of the coated film.

To be more specific, as in the second and fourth aspects of the present invention referred to above, a signal denoting that the discharging of the coating liquid from the coating film discharging nozzle has been actually started is detected in the present invention, and at least one of the drive timing of the pump for allowing the coating liquid to be discharged from the coating liquid discharging nozzle, the operation timing of the valve mounted to the pipe for supplying the coating liquid to the coating nozzle discharging nozzle, and the rotation starting or stopping timing of the target substrate to be processed is controlled on the basis of the detected signal so as to prevent the inconveniences causing the fluctuation of the film thickness such as the inconvenience that the rotating speed of the target substrate to be processed is excessively high in the stage of discharging the coating liquid and the inconvenience that the actual discharging time is short.

In this case, it is possible to obtain a delay time from the timing for actually discharging the coating liquid on the basis of the detected signal denoting that the discharging of the coating liquid has been started and to control based on the delay time thus obtained at least one of the drive timing of the pump for allowing the coating liquid to be discharged from the coating liquid discharging nozzle, the operation timing of the valve mounted to the pipe for supplying the coating liquid into the coating liquid discharging nozzle, and the rotation starting and/or stopping timing of the target object to be processed.

Also, as in the third and fifth aspects of the present invention referred to above, the actual discharging time of the coating liquid can be controlled strictly in the present invention by detecting that the discharging of the coating liquid from the coating liquid discharging nozzle has been actually stopped and by controlling based on a signal of the detection at least one of the stop drive timing of the pump for allowing the coating liquid to be discharged from the coating liquid discharging nozzle, the operation timing of the valve mounted to the pipe for supplying the coating liquid into the coating liquid discharging nozzle, and the rotation stop timing of the target substrate to be processed, with the result that it is possible to further improve the accuracy in the thickness of the coated film and the uniformity of the film thickness.

In this case, it is possible to detect a signal denoting that the discharging of the coating liquid from the coating liquid discharging nozzle has been actually started, to obtain based on the detected signal a delay time from the timing at which the coating liquid should be actually discharged, and to control based on the delay time thus obtained at least one of the stop drive timing of the pump for allowing the coating liquid to be discharged from the coating liquid discharging nozzle, the operation timing of the valve mounted to the pipe for supplying the coating liquid into the coating liquid supply nozzle, and the rotation stop timing of the target substrate to be processed.

A signal denoting that the discharging of the coating liquid has been started or stopped can be detected by an optical detecting device, e.g., an optical sensor. An optical sensor equipped with a fiber sensor for projecting light and a fiber sensor for receiving light is easy to handle and, thus, is adapted for use in the present invention. It is also possible to use a CCD camera as the optical detecting device used for the detection. It is possible to detect that the discharging of the coating liquid has been started or stopped in discharging the coating liquid from the coating liquid discharging nozzle onto the target substrate to be processed or when the coating liquid discharging nozzle discharges the coating liquid in a position retreated from the target substrate to be processed.

According to a sixth aspect of the present invention, there is provided a coating process method in which a coating liquid is discharged onto the surface of a target substrate to be processed while rotating the target substrate so as to expand the coating liquid radially outward on the target substrate and, thus, to form a coated film, comprising the steps of actually detecting the state in starting and/or stopping the discharging of the coating liquid from a coating liquid discharging nozzle; and controlling based on the data detected in the detecting step the operating speed of a valve mounted to a pipe for supplying the coating liquid into the coating liquid discharging nozzle in a manner to permit the state in starting and/or stopping the discharging of the coating liquid to fall within an allowable range.

According to a seventh aspect of the present invention, there is provided a coating process method in which a coating liquid is discharged onto the surface of a target substrate to be processed while rotating the target substrate so as to expand the coating liquid radially outward on the target substrate and, thus, to form a coated film, comprising the steps of detecting that the coating liquid is being actually discharged from the coating liquid discharging nozzle; measuring the actual discharging time during which the discharging of the coating liquid was detected in the detecting step; comparing the actual discharging time measured in the measuring step with the set time for the discharging of the coating liquid; and judging that there is an abnormality in the case where the difference between the actual discharging time and the set time is not smaller than an allowable value.

According to an eighth aspect of the present invention, there is provided a coating process apparatus, comprising a substrate holding member for holding substantially horizontal a target substrate to be processed; a motor for rotating the substrate holding member; a coating liquid discharging nozzle for discharging a coating liquid onto the target substrate held by the substrate holding member; a pump for allowing the coating liquid to be discharged from the coating liquid discharging nozzle; a valve mounted to a pipe for supplying the coating liquid into the coating liquid discharging nozzle; a detecting device for optically detecting the state in starting and/or stopping the discharging of the coating liquid from the coating liquid discharging nozzle; and a controller for controlling based on the data detected by the detecting device the operating speed of the valve in a manner to permit the state in starting and/or stopping the discharging of the coating liquid to fall within an allowable range.

Further, according to a ninth aspect of the present invention, there is provided a coating process apparatus, comprising a substrate holding member for holding substantially horizontal a target substrate to be processed; a motor for rotating the substrate holding member; a coating liquid discharging nozzle for discharging a coating liquid onto the target substrate held by the substrate holding member; a pump for allowing the coating liquid to be discharged from the coating liquid discharging nozzle; a valve mounted to a pipe for supplying the coating liquid into the coating liquid discharging nozzle; a detecting device for optically detecting that the coating liquid is being actually discharged from the coating liquid discharging nozzle; a timer for measuring the actual discharging time during which the discharging of the coating liquid is detected by the detecting device; a controller for comparing the actual discharging time measured by the timer with the set time of the coating liquid discharging; and judging that there is an abnormality in the case where the difference between the actual discharging time and the set time is not smaller than an allowable value.

According to the sixth and eighth aspects of the present invention, the state in starting and/or stopping the discharging of the coating liquid from the coating liquid discharging nozzle is actually detected, and the operating speed of the valve mounted to the pipe for supplying the coating liquid into the coating liquid discharging nozzle is controlled based on the detected data in a manner to permit the state in starting and/or stopping the discharging of the coating liquid to fall within an allowable range. It follows that it is possible to set in advance the state of the coating liquid in the starting and/or stopping time of the discharging operation to fall within an allowable range so as to make it possible to avoid the detrimental effects given by the state of the coating liquid in starting and/or stopping the discharging operation to the accuracy in the thickness of the coated film and to the uniformity of the film thickness.

Further, according to the seventh and ninth aspects of the present invention, it is detected that the coating liquid is being actually discharged from the coating liquid discharging nozzle, the detected actual discharging time is measured, and the measured actual discharging time is compared with the set time of the discharging of the coating liquid. Where the difference between the actual discharging time and the set time is not smaller than an allowable value, it is judged that there is an abnormality so as to grasp an abnormal discharging of the coating liquid so that the discharging of the coating liquid and becomes broken during the coating operation or that the discharging of the coating liquid is not stopped at the stop timing.

DETAILED DESCRIPTION OF THE INVENTION

Some embodiments of the present invention will now be described in detail with reference to the accompanying drawings.

Figure 1:
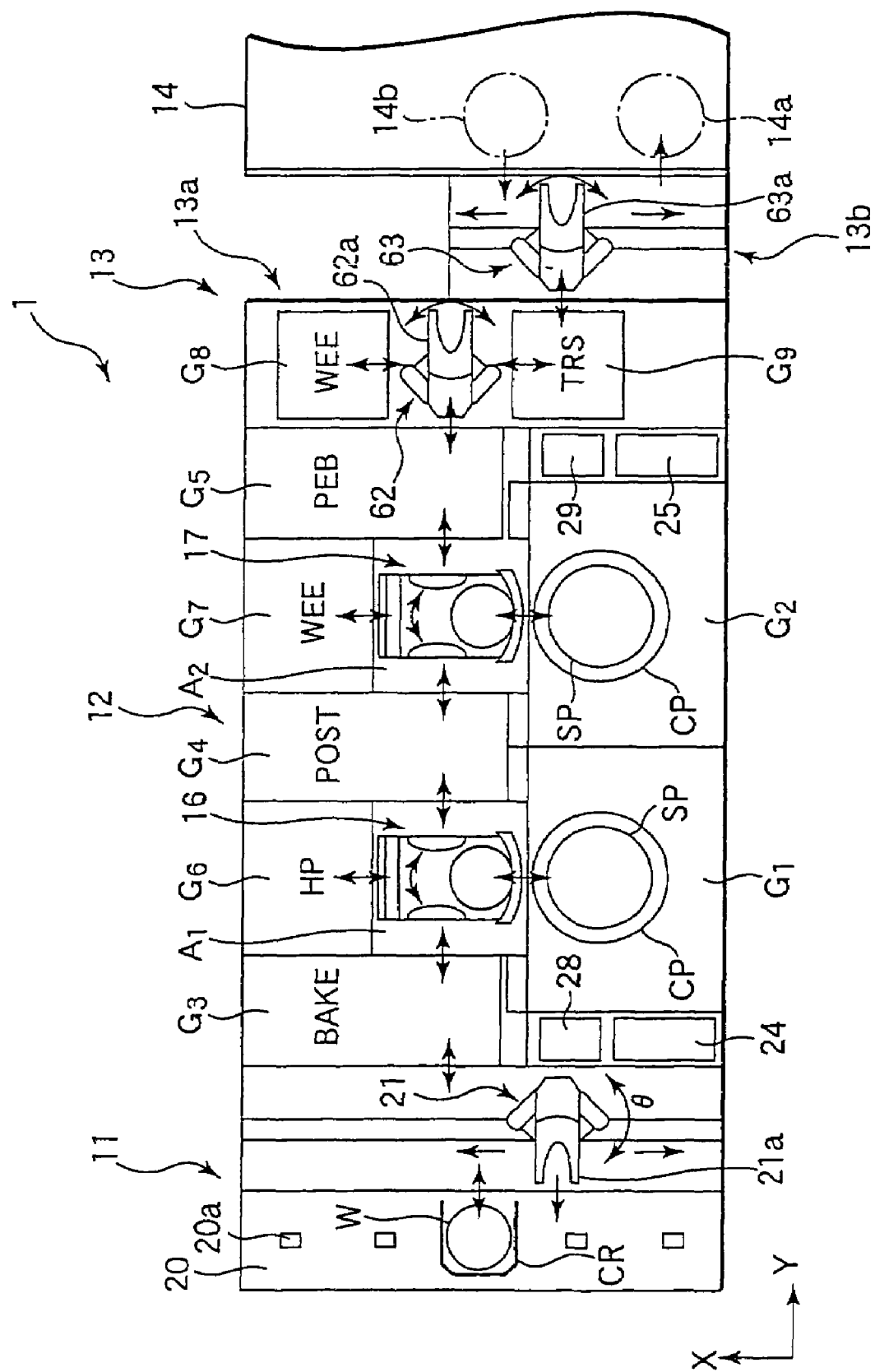
FIG. 1 is a plan view showing the entire construction of a resist coating-developing system of a semiconductor wafer, a resist coating process unit for working the present invention being mounted to the resist coating-developing system.
Figure 2:
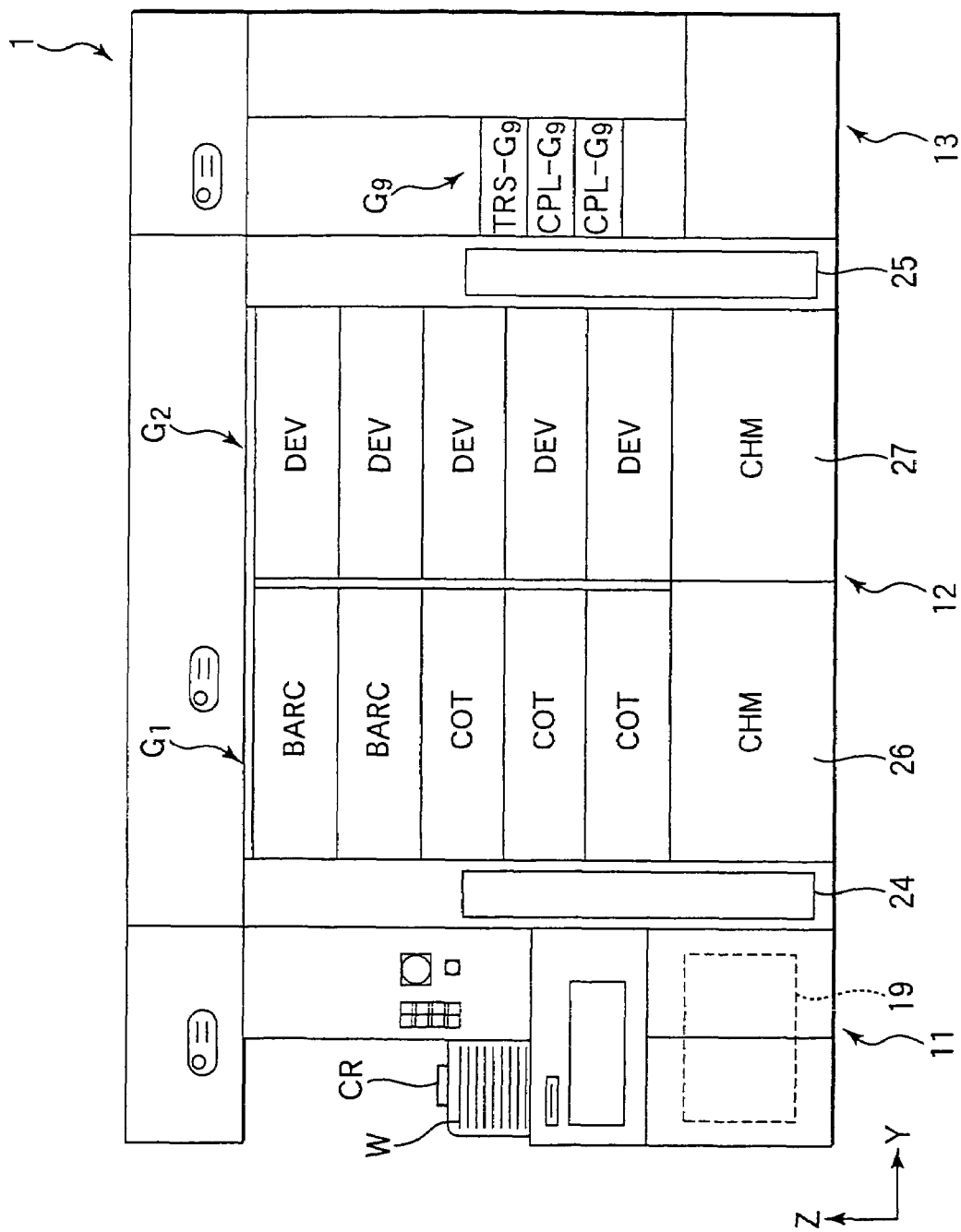
FIG. 2 is a front view of the resist coating-developing system shown in FIG. 1.
Figure 3:
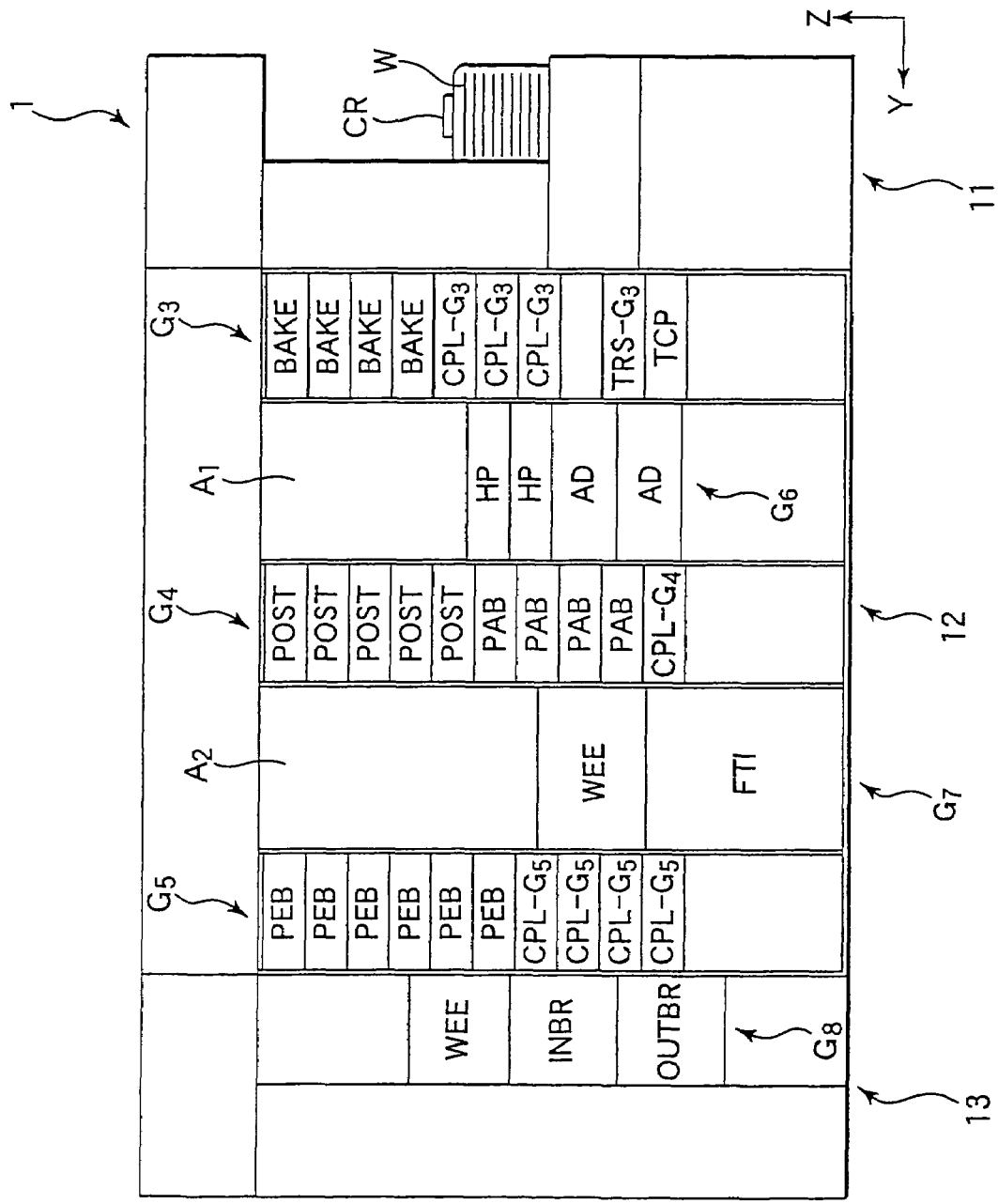
FIG. 3 is a back view of the resist coating-developing system shown in FIG. 1.

FIG. 1 is a plan view schematically showing the resist coating-developing system 1 including a resist coating process unit according to one embodiment of the coating process apparatus of the present invention. On the other hand, FIGS. 2 and 3 are a front view and a back view, respectively, of the resist coating-developing system 1 shown in FIG. 1.

The resist coating-developing system 1 comprises a cassette station 11 acting as a transfer station, a process station 12 including a plurality of process units, and an interface station 13 for the delivery of a wafer W between the process station 12 and a light exposure device 14 arranged adjacent to the process station 12.

A cassette CR housing a plurality of wafers W, e.g., 25 wafers W, which are to be processed in the resist coating-developing system 1, is transferred from another system into the cassette station 11. By contraries, the cassette CR housing the wafers W after completion of the processing in the resist coating-developing system 1 is transferred from the cassette station 11 into the other system. Further, the cassette station 11 serves to transfer the wafer W between the wafer cassette CR and the process station 12.

In the cassette station 11, a plurality of projections 20a for determining the positions, i.e., five projections 20a in FIG. 1, are arranged on a cassette table 20 in a manner to form a row extending in an X-direction, as shown in FIG. 1. The wafer cassette CR is disposed in the position of the projection 20a such that the wafer delivery port of the wafer cassette CR is allowed to face the process station 12. Incidentally, within the wafer cassette CR, the wafers W are arranged to assume a horizontal posture and arranged substantially in parallel in the vertical direction (Z-direction), as shown in FIGS. 2 and 3.

A wafer transfer mechanism 21 is arranged in the cassette station 11 so as to be positioned between the cassette table 20 and the process station 12. The wafer transfer mechanism 21 includes a wafer transfer pick 21a movable in the arranging direction of the cassettes CR (X-direction) and in the arranging direction of the wafers W within the wafer cassette CR (Z-direction). The wafer transfer pick 21a is also swingable in the θ-direction shown in FIG. 1. It follows that the wafer transfer pick is capable of gaining access selectively to any of the wafer cassettes CR and to a transition unit (TRS-$G_3$) arranged in a third process unit group $G_3$ included in the process station 12.

In the process station 12, the third process unit group. $G_3$, a fourth process unit group $G_4$, and a fifth process unit group $G_5$ are arranged on the back side of the system (in an upper portion in FIG. 1) in the order mentioned as viewed from the cassette station 11. Also, a first main transfer section $A_1$ is arranged between the third process unit group $G_3$ and the fourth process unit group $G_4$. Likewise, a second main transfer section $A_2$ is arranged between the fourth process unit group $G_4$ and the fifth process unit group $G_5$. Further, a first process unit group $G_1$ and a second process unit group $G_2$ are arranged on the front side of the system (lower portion in FIG. 1) in the order mentioned as viewed from the cassette station 11.

As shown in FIG. 3, oven type process units, in which a prescribed processing is applied to the wafer W disposed on a table, are stacked one upon the other so as to form the third process unit group $G_3$. To be more specific, stacked in the third process unit group $G_3$ are high temperature heat treating units (BAKE) for applying a prescribed heat treatment to the wafer W, high precision temperature control units (CPL-$G_3$) for applying a heat treatment to the wafer W under the temperature control of a high precision, a temperature control unit (TCP), and the transition unit (TRS-$G_3$) acting as a delivery section of the wafer W between the cassette station 11 and the first main transfer section $A_1$. These process units are stacked one upon the other to form the third process unit group $G_3$ of, for example, a 10-stage structure. Incidentally, a spare space is formed in the third process unit group $G_3$ so as to be positioned in the third stage from the bottom. It is possible to arrange a desired oven type process unit in the spare space.

Stacked on upon the other in the fourth process unit group $G_4$ are, for example, pre-bake units (PAB) for applying a heat treatment to the wafer W after the resist coating treatment, post-bake units (POST) for applying a heat treatment to the wafer W after the developing treatment, and a high precision temperature control unit (CPL-$G_4$). These process units are stacked one upon the other so as to form the fourth process unit group $G_4$ of, for example, a 10-stage structure. Further, stacked one upon the other in the fifth process unit group $G_5$ are, for example, post-exposure bake units (PEB) for applying a heat treatment to the wafer W after the light exposure and before the developing treatment and high precision temperature control units (CPL-$G_5$). These process units are stacked one upon the other so as to form the fifth process unit group $G_5$ of, for example, a 10-stage structure.

As shown in FIGS. 1 and 3, a sixth process unit group $G_6$ including an adhesion unit (AD) and a heating unit (HP) for heating the wafer W is arranged on the back side of the first main transfer section $A_1$. It is possible to allow the adhesion unit (AD) to have the function of controlling the temperature of the wafer W.

A seventh process unit group $G_7$ including a peripheral light exposure device (WEE) for selectively allowing the edge portion alone of the wafer W to be exposed to light and a thickness measuring device (FTI) for measuring the thickness of the resist film is arranged on the back side of the second main transfer section $A_2$. It is possible to arrange a plurality of peripheral light exposure devices (WEE) to form a multi-stage structure. Also, it is possible to arrange a heat treating unit such as the heating unit (HP) on the back side of the second main transfer section $A_2$ as on the back side of the first main transfer section $A_1$.

As shown in FIGS. 1 and 2, five spinner type process units each constituting a liquid supply unit in which a prescribed treatment is applied to the wafer W disposed on a spin chuck SP within a cup (CP) are arranged to form a first process unit group $G_1$. For example, three resist coating units (COT) and two bottom coating units (BARC) for forming an antireflection film for preventing the light reflection during the light exposure treatment are stacked one upon the other so as to form the first process unit group $G_1$ of, for example, a 5-stage structure. On the other hand, five spinner type process units, e.g., developing units (DEV), are stacked one upon the other so as to form a second process unit group $G_2$ of a 5-stage structure.

A first main wafer transfer device 16 is arranged in the first main transfer section $A_1$. The first main wafer transfer device 16 is capable of selectively gaining access to any of the process units arranged in the first process unit group $G_1$, the third process unit group $G_3$, the fourth process unit group $G_4$, and the sixth process unit group $G_6$. Also, a second main wafer transfer device 17 is arranged in the second main transfer section $A_2$. The second main wafer transfer device 17 is capable of selectively gaining access to any of the process units arranged in the second process unit group $G_2$, the fourth process unit group $G_4$, the fifth process unit group $G_5$, and the seventh process unit group $G_7$.

Figure 4:
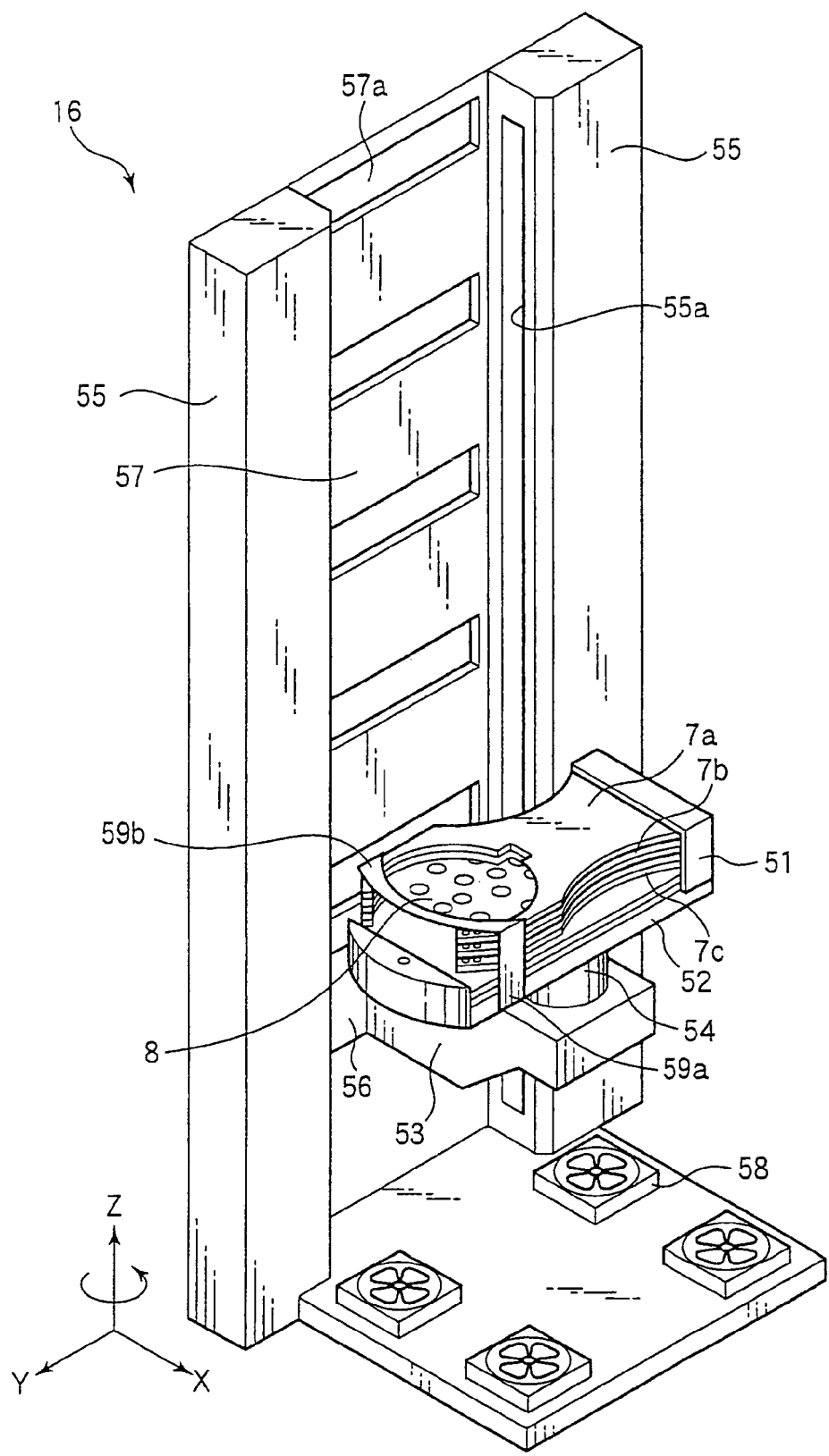
FIG. 4 is an oblique view schematically showing the construction of a main wafer transfer device mounted to the resist coating-developing system shown in FIG. 1.

FIG. 4 is an oblique view schematically showing the construction of the first main wafer transfer device 16. As shown in the drawing, the first main wafer transfer device 16 comprises three arms, i.e., an arm 7a in the upper stage, an arm 7b in the middle stage and an arm 7c in the lower stage, an arm support plate 51 mounted to the proximal end portion of each of the arms 7a to 7c (the support plate 51 mounted to the arm 7a alone being shown in the drawing), a base 52 engaged with each of the arm support plates 51, a support section 53 for supporting the base 52, etc., a motor (not shown) housed within the support section 53, a rotatable rod 54 for joining the base 52 to the motor, support rods 55 arranged on the sides of the first process unit group $G_1$ and the second process unit group $G_2$ and each having a sleeve 55a formed therein in a manner to extend in the vertical direction, a flange member 56 slidably engaged with the sleeve 55a and joined to the support section 53, and a lift mechanism (not shown) for moving the flange member 56 in the vertical direction.

Rails (not shown) for the arm support plates 51 are formed on the base 52 in a manner to extend in the direction parallel to the longitudinal direction of the base 52 so as to permit each of the arm support plates 51 to be slidable along the rail. Also, if the motor arranged within the support section 53 is rotated, the rotatable rod 54 is rotated so as to permit the base 52 to be rotated within an X-Y plane. Further, since the support section 53 is mounted to the flange member 56 movable in the Z-direction, the base 52 is also movable in the Z-direction.

Because of the particular construction described above, the arms 7a to 7c of the first main wafer transfer device 16 are movable in any of the X-direction, the Y-direction and the Z-direction, with the result that these arms 7a to 7c are capable of gaining access to any of the process units included in the first process unit group $G_1$, the third process unit group $G_3$, the fourth process unit group $G_4$, and the sixth process unit group $G_6$ as described previously.

Vertical members 59a are mounted to both sides in the tip portion of the base 52. Also, a shielding plate 8 positioned between the arm 7a and the arm 7b for shielding the heat radiated from these arms 7a, 7b is mounted to these vertical members 59a. Further, a bridging member 59b is mounted between these vertical members 59a. A pair of optical sensors (not shown) are mounted to the center of the bridging member 59b and to the tip portion of the base 52 so as to make it possible to confirm the presence or absence of the wafer W on each of the arms 7a to 7c and to confirm the protrusion of the wafer W from any of these arms 7a to 7c. It should be noted that the second main wafer transfer device 17 is substantially equal in construction to the first main wafer transfer device 16 described above.

Incidentally, a wall section 57 shown in FIG. 4 constitutes a part of the housing of the second main wafer transfer section $A_2$ on the side of the first process unit group $G_1$. A widow section 57a formed in the wall section 57 facilitates the wafer delivery between the process units included in the first process unit group $G_1$. Also, four fans 58 arranged on the bottom portion of the second main wafer transfer section $A_2$ serve to control the pressure, temperature and humidity within the second main wafer transfer section $A_2$.

A liquid temperature control pump 24 for supplying a prescribed process solution to the first process unit group $G_1$ is arranged between the first process unit group $G_1$ and the cassette station 11. Likewise, a liquid temperature control pump 25 for supplying a prescribed process solution to the second process unit group $G_2$ is arranged between the second process unit group $G_2$ and the interface section 13. Further, arranged are ducts 28, 29 for supplying a clean air from an air conditioner (not shown) arranged outside the resist coating-developing system 1 into the process unit groups $G_1$ to $G_5$.

The first process unit group $G_1$ to the seventh process unit group $G_7$ are detachable for the maintenance operation. Also, the panel on the back side of the process station 12 is detachable or openable. Chemical units (CHM) 26 and 27 for supplying a prescribed process solution to the first process unit group $G_1$ and the second process unit group $G_2$ are arranged in the lowermost stages of the first process unit group $G_1$ and the second process unit group $G_2$, respectively. Further, a central control section 19 for controlling the entire resist coating-developing system 1 is arranged in a lower portion of the cassette station 11.

The interface station 13 comprises a first interface station 13a on the side of the process station 12 and a second interface station 13b on the side of the light exposure device 14. A first wafer transfer body 62 is arranged in the first interface section 13a in a manner to face the open portion of the fifth process unit group $G_5$, and a second wafer transfer body 63 movable in the X-direction is arranged in the second interface station 13b.

Arranged on the back side of the first wafer transfer body 62 is an eighth process unit group $G_8$ including a peripheral light exposure device (WEE), an in-buffer cassette (INBR) for temporarily housing the wafer W that is to be transferred into the light exposure device 14, and an out-buffer cassette (OUTBR) for temporarily housing the wafer W transferred out of the light exposure device 14. These process units are stacked one upon the other in the order mentioned as viewed from above. A plurality of wafers W, e.g., 25 wafers W, can be housed in each of the in-buffer cassette (INBR) and the out-buffer cassette (OUTBR). Also, arranged on the front side of the first wafer transfer body 62 is a ninth process unit $G_9$ including a transition unit (TRS-$G_9$) and two high precision temperature control units (CPL-$G_9$), which are stacked one upon the other in the order mentioned as viewed from above.

The first wafer transfer body 62 is provided with a fork 62a movable in the Z-direction, swingable in the θ-direction and movable back and forth within an X-Y plane. The fork 62a is capable of gaining access to any of the process units included in the fifth process unit group $G_5$, the eighth process unit group $G_8$, and the ninth process unit group $G_9$ so as to make it possible to transfer the wafer W between the process units included in these process unit groups.

The second wafer transfer body 63 is movable in the X-direction and Z-direction, swingable in the θ-direction and provided with a fork 63a movable back and forth within an X-Y plane for delivering the wafer W. The fork 63a is capable of gaining access to each of the process units included in the ninth process unit group $G_9$, and to an in-stage 14a and an out-stage 14b included in the light exposure device 14 so as to make it possible to transfer the wafer W among these members.

In the resist coating-developing system 1 of the construction described above, unprocessed wafers W are taken out one by one from the wafer cassette CR by the wafer transfer mechanism 21 so as to be transferred into the transition unit (TRS-$G_3$). Then, after a temperature control treatment is applied to the wafer W in the temperature control unit (TCP), an antireflection film is formed on the wafer W in the bottom coating unit (BARC) belonging to the first process unit group $G_1$, followed by applying a heat treatment to the wafer W in the heating unit (HP) and subsequently applying a baking treatment to the wafer W in the high temperature heat treating unit (BAKE). It is possible to apply an adhesion treatment to the wafer W in the adhesion unit (AD) before formation of the antireflection film on the wafer W in the bottom coating unit (BARC). It is also possible to apply an adhesion treatment to the wafer W without forming an antireflection film on the wafer W. Then, after the temperature of the wafer W is controlled in the high precision temperature control unit (CPL-$G_4$), the wafer W is transferred into the resist coating unit (COT) belonging to the first process unit group $G_1$ for application of the coating treatment with a resist/ solution. Further, a pre-bake treatment is applied to the wafer W in the pre-bake unit (PAB) arranged in the fourth process unit group $G_4$, followed by applying a peripheral light exposure treatment to the wafer W in the peripheral light exposure device (WEE) and subsequently controlling the temperature of the wafer W in the high precision temperature control unit (CPL-$G_9$), etc. Then, the wafer W is transferred by the second wafer transfer body 63 into the light exposure device 14. The exposed wafer W in the light exposure device 14 is transferred by the second wafer transfer body 63 into the transition unit (TRS-$G_9$) and, then, further transferred by the first wafer transfer body 62 into the post-exposure bake unit (PEB) belonging to the fifth process group $G_5$ for application of the post-exposure bake treatment to the wafer W. Further, the wafer W is transferred into the developing unit (DEV) belonging to the second process unit group $G_2$ for developing the wafer W, followed by applying a post-bake treatment to the wafer W in the post-bake unit (POST). Still further, a temperature control treatment is applied to the wafer W in the high precision temperature control unit (CPL-$G_3$), followed by transferring the wafer W onto a prescribed position within the wafer cassette CR arranged in the cassette station 11 through the transition unit (TRS-$G_3$).

A resist coating process unit (COT) according to one embodiment of the present invention will now be described with reference to FIGS. 5 to 8.

The resist coating process unit (COT) comprises a casing 70 provided with an opening 70a through which the arms 7a to 7c of the main wafer transfer device 16 are allowed to pass. A cup CP constituting a container for housing the wafer W therein is arranged within the casing 70. Further, a spin chuck 71 for horizontally holding thereon the wafer W by the vacuum suction is arranged within the cup CP. The spin chuck 71 can be rotated by a driving motor 72 such as a pulse motor arranged below the cup CP, and the rotating speed of the spin chuck 71 can be controlled optionally. An exhaust pipe 73 is connected to a central region in the bottom portion of the cup CP, and a liquid discharge pipe 74 is connected to an outer region in the bottom portion of the cup CP. The gas within the cup CP is exhausted through the exhaust pipe 73, and the resist solution and the solvent scattered during the coating treatment are discharged to the outside through the liquid discharge pipe 74. Incidentally, the spin chuck 71 can be moved in the vertical direction by a lift mechanism such as an air cylinder (not shown).

A discharging head 80 is arranged above the spin chuck 71 so as to be movable between a position right above the spin chuck 71 and a retreating position. The discharging head 80 is connected to a driving mechanism 83 with an arm 81 interposed therebetween so as to be movable in the X-direction, the Y-direction and the Z-direction shown in FIGS. 5 and 6. Incidentally, the discharging head 80 is detachable from the arm 81.

The discharging head 80 includes a base member 82 and is constructed such that a solvent discharging nozzle 85 for supplying a solvent capable of dissolving a resist solution and a resist solution discharging nozzle 90 for supplying a resist solution constituting a coating liquid are mounted close to each other to the base member 82. The solvent capable of dissolving the resist solution permits improving the wettability of the resist solution so as to lower the consumption of the resist. It is possible for the solvent capable of dissolving the resist solution to constitute a solvent of the resist solution. However, the solvent capable of dissolving the resist solution is not limited to the solvent of the resist solution, and a thinner is typically used as the solvent capable of dissolving the resist solution.

Mounted to the discharging head 80 are a pipe (not shown) for circulating a temperature control fluid for maintaining constant the temperature of the resist solution discharged from the resist solution discharging nozzle 90 and another pipe (not shown) for circulating a temperature control fluid for maintaining constant the temperature of the solvent discharged from the solvent discharging nozzle 85.

A resist solution supply pipe 91 is connected to the resist solution discharging nozzle 90, and the resist solution supply pipe 91 is allowed to communicate with a resist solution tank 92 housing a resist solution. Connected to the resist solution supply pipe 91 are a suck back valve 93, an air operation valve 94, a bubble removing mechanism 95 for separating and removing bubbles from the resist solution, a filter 96, and a pump 97 in the order from the downstream side. It is desirable to use as the pump 97 a bellows pump including a shrinkable bellows or a tubephragm pump including a tubephragm that is shrunk by the liquid pressure so as to send forth the resist solution. A solvent supply pipe 86 is connected to the solvent discharging nozzle 85 such that the solvent supplied from a solvent supply source (not shown) flows through the solvent supply pipe 86 so as to be discharged from the solvent discharging nozzle 85.

Figure 6:
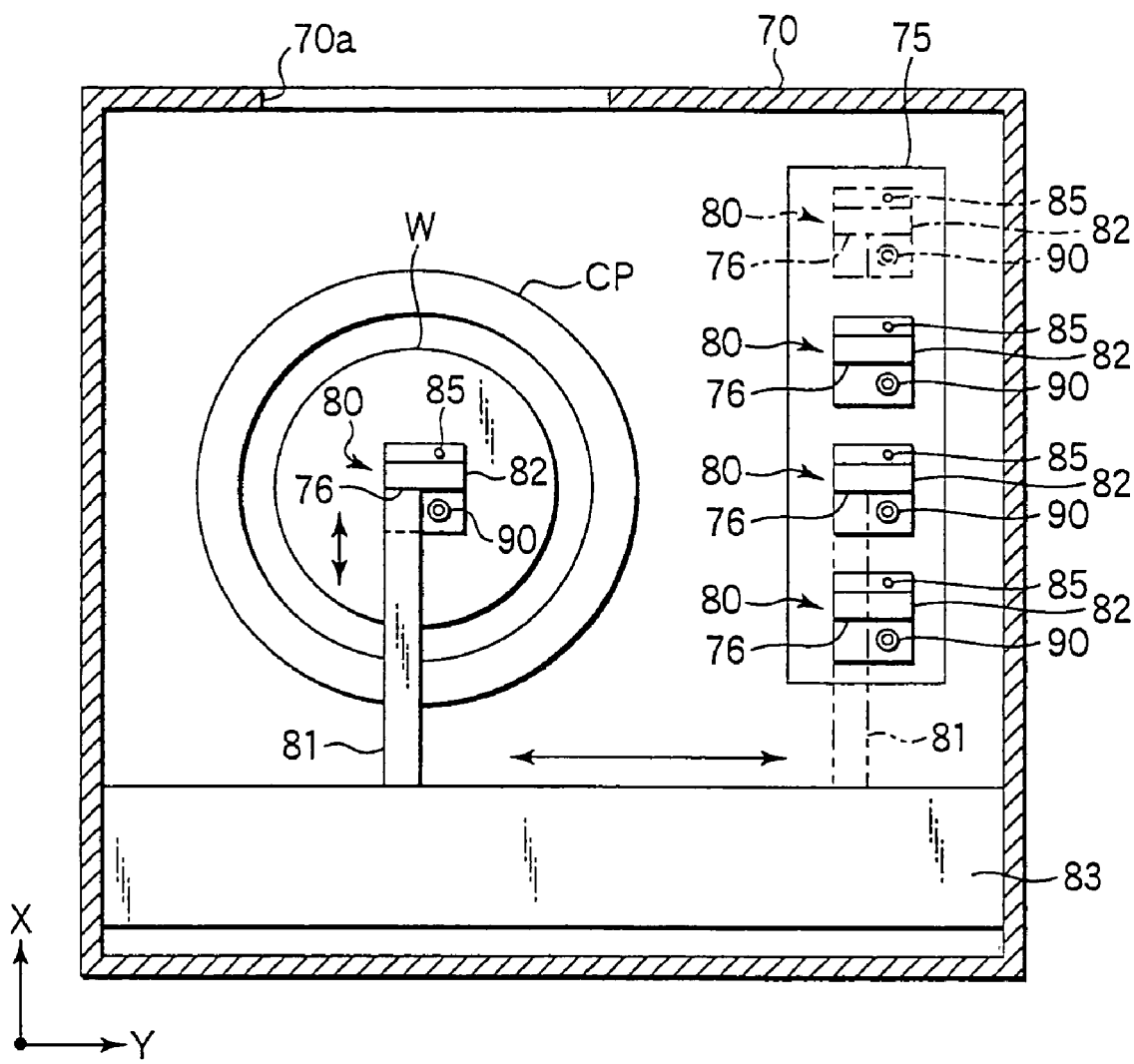
FIG. 6 is a plan view of the resist coating process unit shown in FIG. 4.

As shown in FIG. 6, a holding section 75 capable of holding four discharging heads 80, which basically have the same construction, is arranged outside the cup CP within the casing 70. Arranged in the holding section 75 is an inserting section (solvent drain section) for putting the nozzle port of each nozzle under a solvent atmosphere so as to prevent the nozzle port of each nozzle from being dried and solidified. Each discharging head 80 can be mounted to the tip portion of the arm 81 by a mounting section 76. Different kinds of resist solutions can be supplied into the discharging heads 80. One selected discharging head 80 is mounted to the arm 81 and is taken from the holding section 75. As described above, it is possible for the arm 81 to be moved by the driving mechanism 83 in three dimensional directions, i.e., in the X-, Y- and Z-directions, such that the discharging head 80 mounted to the arm 81 taken out of the holding section 75 is moved to a prescribed position right above the wafer W in processing the wafer W.

In the example shown in FIG. 6, the solvent discharging nozzle 85 and the resist solution discharging nozzle 90 are mounted to each discharging head 80. However, it is also possible to mount the resist solution discharging nozzle 90 alone to each discharging head 80 and to mount a single solvent discharging nozzle 80 for the common use with the resist solution discharging nozzles 90 of the discharging heads 80. In this case, it is possible to arrange separately a driving arm for the solvent discharging nozzle 85. It is also possible to mount in advance the solvent discharging nozzle 85 to the arm 81 so as to permit the solvent discharging nozzle 85 to be movable together with one discharging head 80 that has been selected.

The resist coating process unit (COT) according to this embodiment of the present invention comprises an optical fiber sensor apparatus 100. The optical fiber sensor apparatus 100 includes an optical fiber sensor 101 for projecting light, which is mounted to the solvent discharging nozzle 85, an optical fiber sensor 102 for receiving light, which is mounted to a mounting bracket 87 mounted to face downward to the central portion of the arm 81, a light source 103 to which the optical fiber sensor 101 for projecting light is connected, an amplifier 104 for amplifying the light received by the optical fiber sensor 102 for receiving light, and a sensor controller 105 for controlling the entire optical fiber sensor apparatus such as the processing of the received optical signal. The light projecting optical fiber sensor 101 projects light such that the projected light traverses the discharged stream of the resist solution in the case where the resist solution is being discharged from the resist solution discharging nozzle 90. The light receiving optical fiber sensor 102 receives the light projected from the optical fiber sensor 101 for projecting light and, then, reflected from the wafer W. Since the case where the resist solution is being discharged from the resist solution discharging nozzle 90 differs from the case where the resist solution is not discharged from the resist solution discharging nozzle 90 in the amount of the light detected by the light receiving optical fiber sensor 102, it is possible for the optical fiber sensor apparatus 100 to detect the initiation of the discharging of the resist solution.

Figure 5:
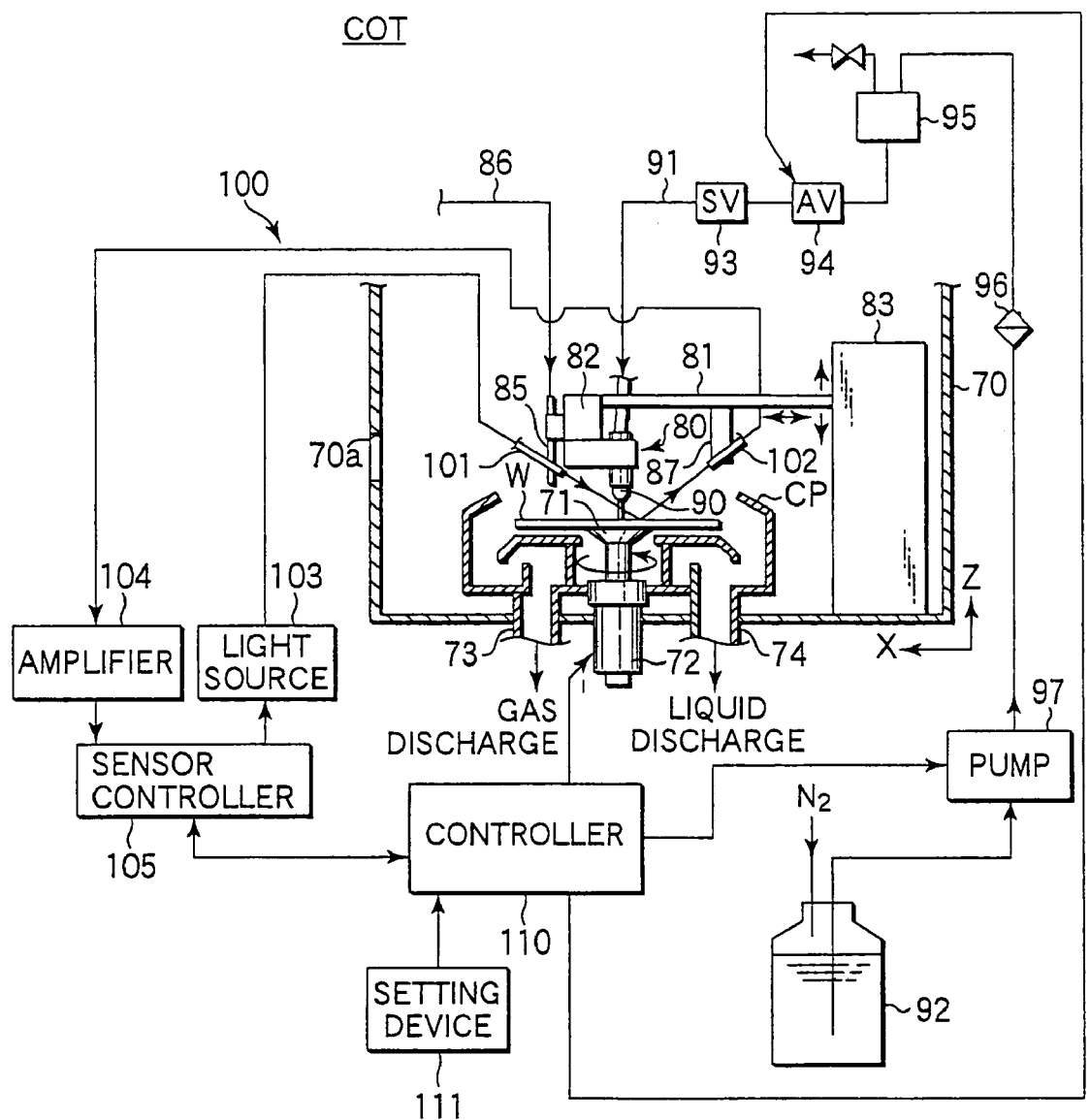
FIG. 5 is a cross sectional view showing the entire construction of the resist coating process unit mounted to the resist coating-developing system shown in FIG. 1.

The resist coating process unit (COT) according to this embodiment of the present invention comprises a controller 110 as shown In FIG. 5. It is possible for the controller 110 to control The driving motor 72 rotating the spin chuck 71, the air operation valve 94 and the pump 97. Also, a setting device 111 for setting, for example, the control conditions in the controller 110 is connected to the controller 110. Further, the sensor controller 105 is connected to the controller 110. A control signal is transmitted from the sensor controller 105 to the optical fiber sensor apparatus 100, and a signal transmitted from the optical fiber sensor apparatus 100 is received by the sensor controller 105.

When the optical fiber sensor apparatus 100 has detected that the resist solution discharging nozzle 90 has started discharging the resist solution therefrom, the detected signal is transmitted to the controller 110 and the controller 110 calculates the resist solution discharging timing based on the detected signal. Also, the controller controls at least one of the driving motor 72 for rotating the spin chuck 71, the air operation valve 94 and the pump 97 based on the calculated discharging timing of the resist solution. As a result, the timing between the rotation of the wafer W and the discharging of the resist solution and the discharging time of the resist solution, which are important for the coating operation of the resist solution, are controlled appropriately.

In this case, it is possible for the controller 110 to perform the control operation automatically based on the calculated discharging timing of the resist solution. Alternatively, it is also possible for the operator to set the parameters of the setting device 111 based on the grasped discharging timing of the resist solution.

Figure 7:
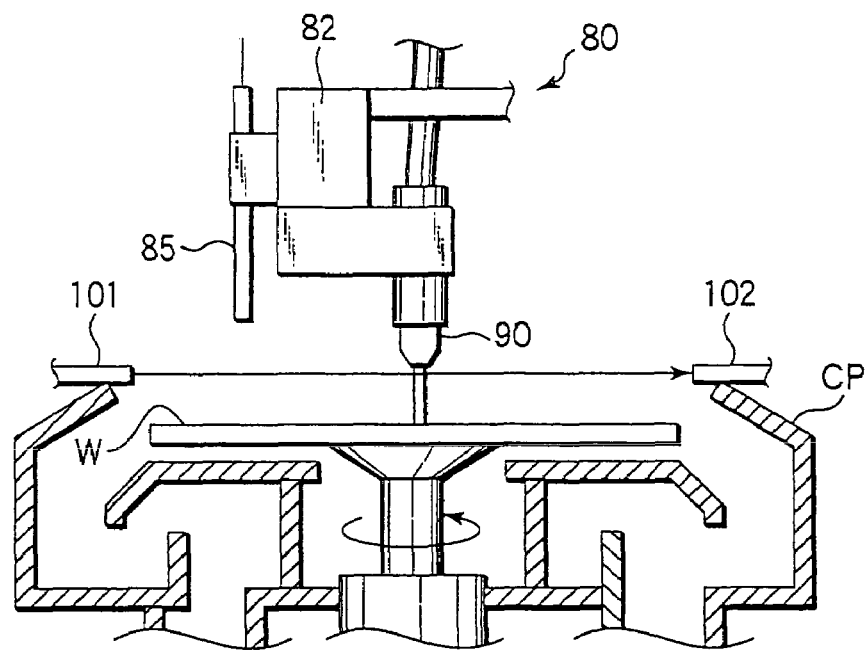
FIG. 7 is a cross sectional view showing another example in respect of the mounting positions of a fiber sensor for projecting light and a fiber sensor for receiving light, which are included in an optical fiber sensor apparatus.

It is possible to mount the light projecting optical fiber sensor 101 and the light receiving optical fiber sensor 102 included in the optical fiber sensor apparatus 100 to the cup CP, as shown in FIG. 7. In this case, it is possible to allow the light projected from the light projecting optical fiber sensor 101 to reach the receiving optical fiber sensor 102 without being reflected by the wafer W.

Figure 8:
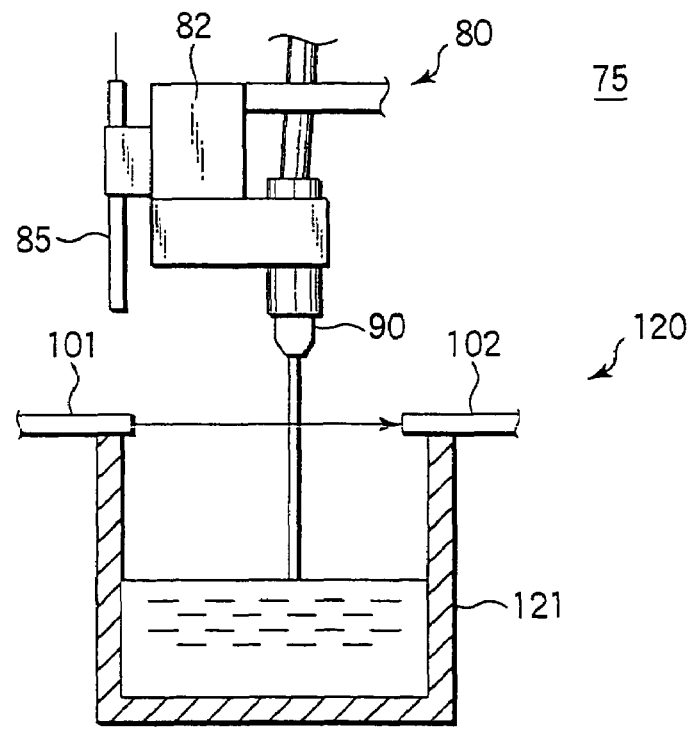
FIG. 8 is a cross sectional view showing still another example in respect of the mounting positions of a fiber sensor for projecting light and a fiber sensor for receiving light, which are included in an optical fiber sensor apparatus.

In addition, it is possible to construct the optical fiber sensor apparatus 100 to detect the discharging timing of the resist solution not only in the case of the actual discharging of the resist solution onto the wafer W as in the description given above but also in the case of the dummy dispense that does not necessitate the presence of the wafer W. As shown in FIG. 8, it is possible to mount the light projecting optical fiber sensor 101 and the light receiving optical fiber sensor 102 to a drain case 121 included in a solvent drain section 120 of the holding section 75 outside the cup CP so as to detect the discharging timing of the resist solution in the case of the dummy dispense.

In the example shown in FIG. 5, it is difficult for the reflected light to reach the light receiving optical fiber sensor 102 after the discharging of the resist solution, with the result that the operation of the optical fiber sensor apparatus 100 is limited to the detection of the discharging initiation of the resist solution. However, in the example shown in each of FIGS. 7 and 8, the optical fiber sensor apparatus 100 is free from the limitation given above and, thus, is of course capable of detecting the discharging initiation of the resist solution and is also capable of detecting that the resist solution has ceased to be discharged. In this case, the controller 110 is capable of controlling based on the detected signal at least one of the drive timing for stopping the pump 97, the operation timing of the air operation valve 94, and the timing for stopping the rotation of the driving motor 72.

Incidentally, the controller 110 actually controls the suck back valve 93 and other members relating to the coating process of the resist solution such as a solvent supply system (not shown), though the description thereon is omitted herein. Also, the suck back valve 93 serves to suck the resist solution remaining by the surface tension on the inner wall portion at the tip of the resist solution discharging nozzle 90 back into the resist solution discharging nozzle 90 after the discharging of the resist solution from the resist solution discharging nozzle 90 so as to prevent the remaining resist solution from being solidified.

Figure 9:
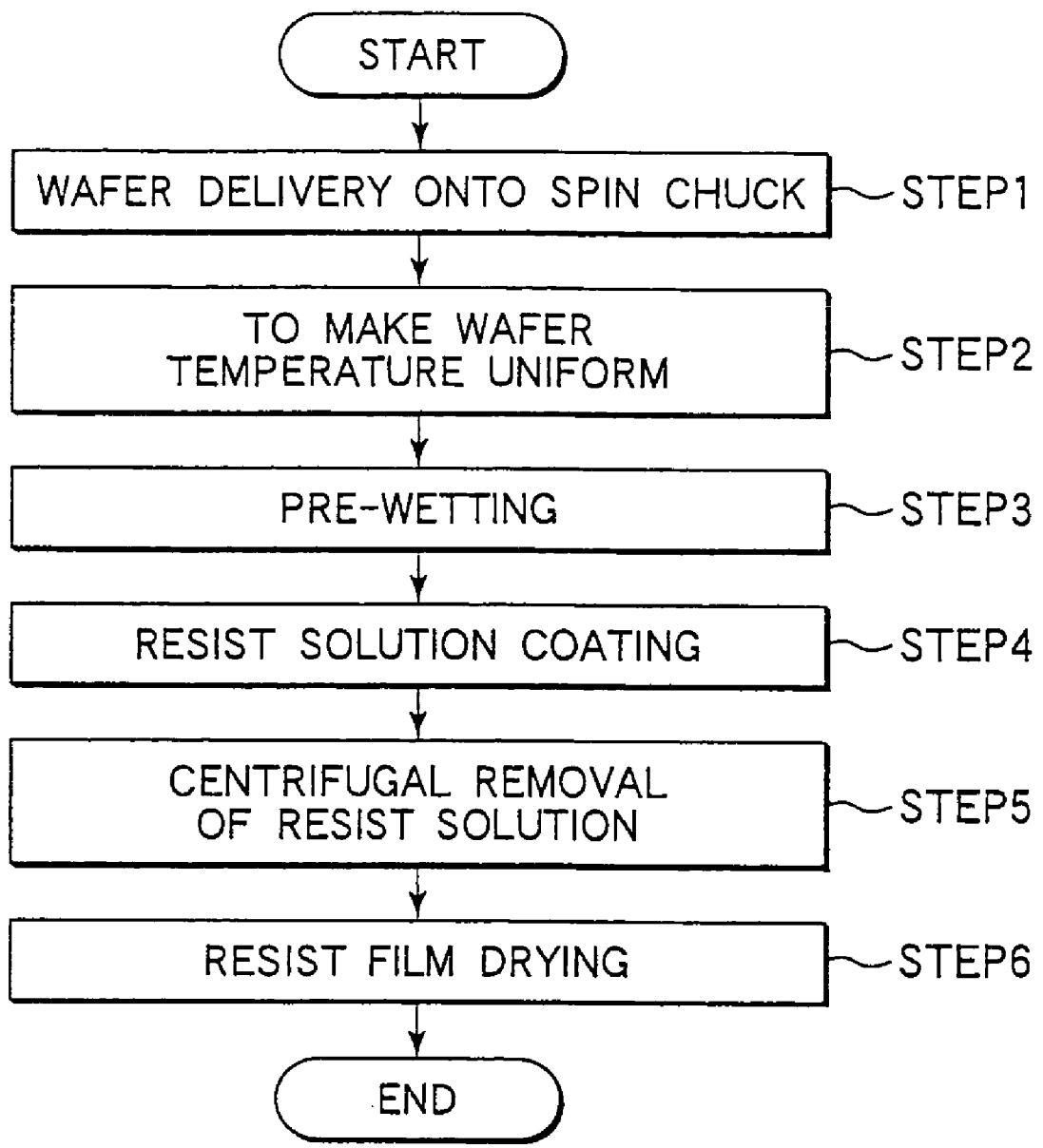
FIG. 9 is a flow chart showing the process steps carried out in the resist coating process unit.

The operation and control of the resist solution coating process performed by the resist coating process unit (COT) constructed as described above will now be described with reference to the flow chart shown in FIG. 9.

If the wafer W is transferred by any of the arms 7a, 7b and 7c of the first main wafer transfer device 16 through the opening 70a of the casing 70 to reach a position right above the cup CP within the resist coating process unit (COT), the wafer W is sucked by vacuum suction by the spin chuck 71 moved upward by the lift mechanism (not shown). After the wafer W is sucked by the spin chuck 71 by the vacuum suction, the main wafer transfer mechanism 22 brings back the arm 7a, 7b, or 7c from within the resist coating process unit (COT) so as to finish the delivery of the wafer W into the resist coating process unit (COT) (STEP 1).

Then, the spin chuck 71 is moved downward until the wafer W is located at a prescribed position within the cup CP. Under this condition, the spin chuck 71 is rotated by the driving motor 72 at a rotating speed of about 1,000 rpm so as to make the temperature of the wafer W uniform (STEP 2).

After the temperature of the wafer W is made uniform, the discharging head 80 is moved in the Y-direction by the driving mechanism 83 to reach a position right above the wafer W. When the discharging port of the solvent discharging nozzle 85 has been moved to reach a position substantially above the center of the spin chuck 71 (substantially above the center of the wafer W), performed is a pre-wet processing in which a solvent dissolving the resist such as a thinner is supplied onto substantially the center on the surface of the wafer W that is held stationary, and the wafer W is rotated at a prescribed rotating speed, preferably not higher than 1,000 rpm, so as to spread the solvent supplied onto the central portion on the surface of the wafer W over the entire surface region of the wafer W (STEP 3). As a result, the wettability of the resist solution is improved so as to decrease the amount of the resist solution discharged onto the wafer W.

In the next step, the discharging head 80 is moved by the driving mechanism 83 in the Y-direction until the discharging port of the resist solution discharging nozzle 90 reaches a point substantially right above the center of the spin chuck 71, i.e., substantially right above the center of the wafer W. Under this condition, the rotating speed of the wafer W is increased to reach a prescribed value, and the resist solution is supplied from the discharging port of the resist solution discharging nozzle 90 onto substantially the center on the surface of the rotating wafer W. As a result, the resist solution is centrifugally diffused outward on the wafer surface so as to coat the entire surface of the wafer W with the resist solution (STEP 4). In carrying out the resist coating treatment, the wafer W is rotated at a relatively high speed in the initial stage while supplying the resist solution onto the wafer surface so as to expand the resist solution supplied onto the wafer surface. To be more specific, it is desirable to rotate the wafer at a speed of 2,000 to 6,000 rpm in the case of the wafer having a diameter of 200 mm, and at a speed of 1,000 to 4,000 rpm in the case of the wafer having a diameter of 300 mm. Then, the supply of the resist solution is stopped and the rotating speed of the wafer W is lowered. As a result, the function of controlling the thickness of the resist film is produced so as to promote the effect of making uniform the thickness of the resist film on the wafer surface. It should be noted in this connection that, when the rotating speed of the semiconductor wafer W is lowered, the force directed toward the center of the wafer W is exerted on the resist solution on the wafer W by the deceleration. In addition, since the rotating speed of the wafer W is low, the resist solution on the wafer W is dried slowly. It follows that the function of controlling the thickness of the resist film is exhibited as described above. To be more specific, the amount of the resist solution scattered toward the outside of the wafer W is suppressed by the force directed toward the center of the wafer W, which is produced by the deceleration. Likewise, the resist solution is held on the outer circumferential portion of the wafer W as in the central portion. It follows that the thickness of the resist film is made more uniform. It is desirable for the rotating speed of the wafer W to be 50 to 1,000 rpm in this case. Particularly, where the rotating speed of the wafer W is not higher than 500 rpm, the drying of the resist solution scarcely proceeds, leading to a higher degree of freedom in terms of the film thickness control. The holding time in this case is set appropriately not to exceed, for example, three seconds. Incidentally, it is not absolutely necessary to lower the rotating speed of the wafer W. In other words, the rotating speed of the wafer W is lowered, as required.

In the next step, the rotating speed of the wafer W is increased so as to centrifugally remove the extra resist solution (STEP 5). It is desirable to set the rotating speed in this stage at 1,500 to 4,000 rpm in the case of the wafer having a diameter of 200 mm, and at 1,000 to 3,000 rpm in the case of the wafer having a diameter of 300 mm.

Then, the rotation of the wafer W is continued so as to dry the resist film (STEP 6). It is desirable to set the rotating speed in this stage at 1,000 to 2,000 rpm in the case of the wafer having a diameter of 200 mm, and at 500 to 1,500 rpm in the case of the wafer having a diameter of 300 mm. The resist coating process is finished after the drying process is carried out for a prescribed period of time.

The control in the resist coating process will now be described in detail.

Figure 10:
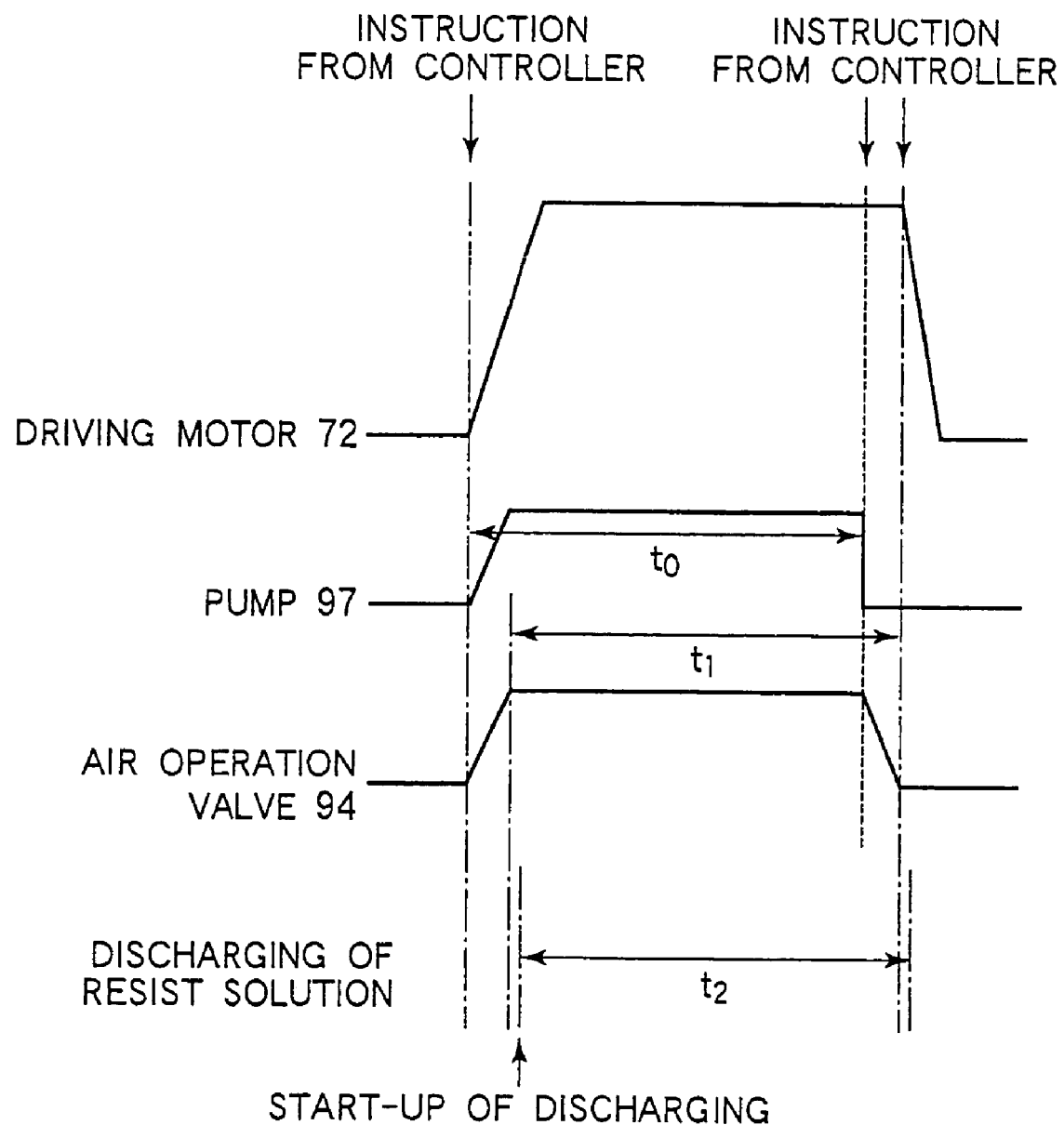
FIG. 10 is a graph showing the operation timings of a driving motor, a pump, and an air operation valve when the coating of a resist solution is carried out under the conventional control method and also showing an ideal timing of the discharging of the resist solution.

In order to form the resist film at a high accuracy and at a high uniformity in the film thickness, it was customary to control strictly the rotation of the driving motor 72, the operation of the pump 97, and the operation of the air operation valve 94, which is an opening-closing valve, based on a software. FIG. 10 is a graph showing the ideal timings of these operations and the discharging timing of the resist solution in the case of carrying out the resist solution coating under the conventional control method. In the first step, a signal to start the driving, a signal to start the discharge operation, and an open signal are simultaneously transmitted from the controller 110 to the driving motor 72, the pump 97 and the air operation valve 94, respectively. As a result, the rotation of the spin chuck 71 is started and the rotating speed of the spin chuck 71 is increased. The pump 97 begins to discharge the resist solution substantially simultaneously with the instruction given from the controller 110. On the other hand, the air operation valve 94 is opened slightly later, and the discharging of the resist solution is started immediately after the air operation valve 94 is opened. The discharging of the resist solution is controlled such that the discharging is started while the wafer W, which is rotated together with the spin chuck 71, is being rotated at a low speed. After the discharging time to on the signal, a signal to finish the discharge operation and a close signal are transmitted simultaneously from the controller 110 to the pump 97 and the air operation valve 94, respectively, as shown in FIG. 10. Slightly after these signals are transmitted, the air operation valve 94 is actually closed. At this stage, a signal to stop the driving is transmitted to the driving motor 72 so as to lower the rotating speed of the wafer W. In this case, each of the open time $t_1$ of the air operation valve 94 and the actual discharge time $t_2$ substantially coincides with the discharge time $t_0$ and, thus, no problem is generated.

Figure 11:
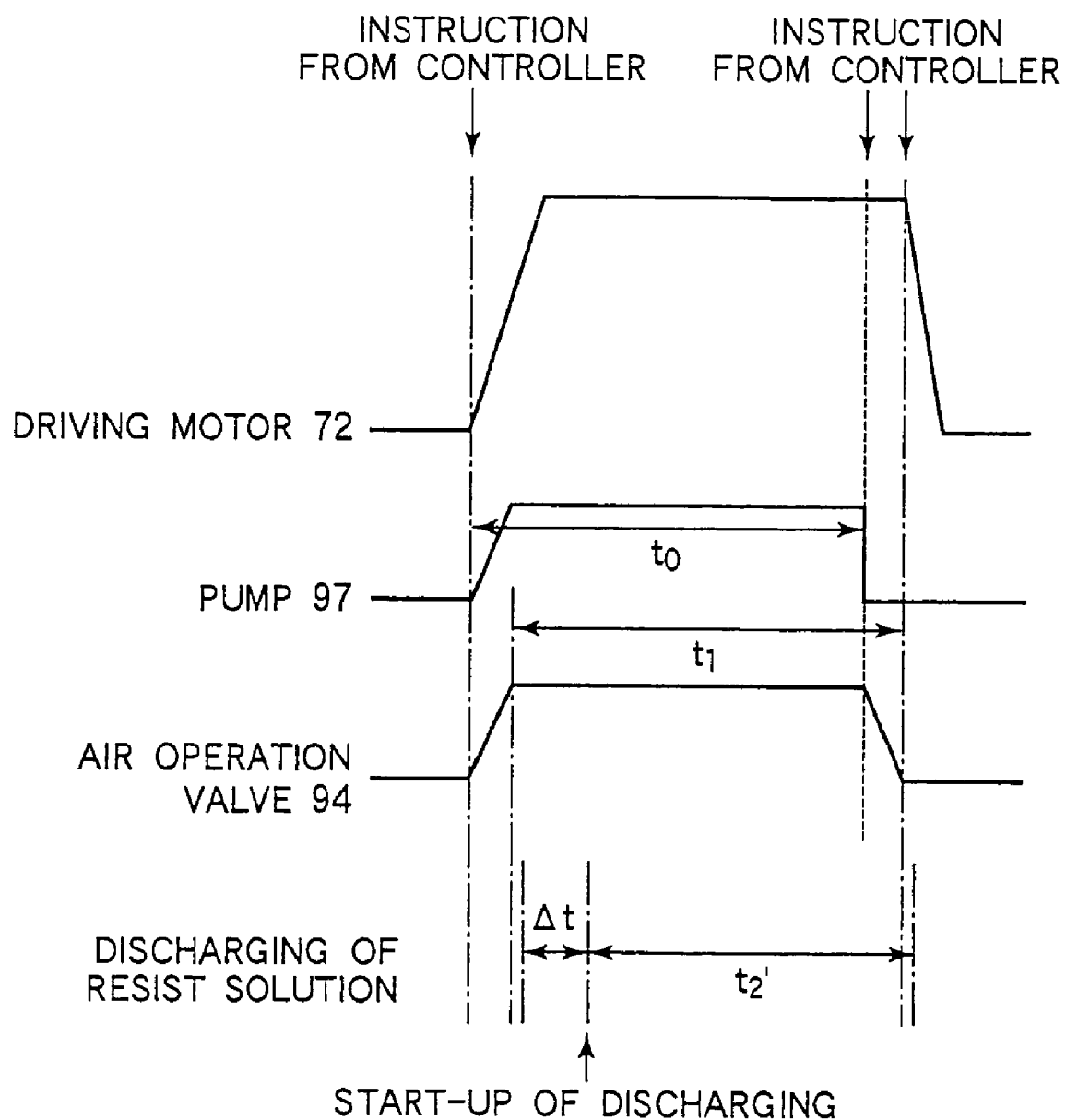
FIG. 11 is a graph showing the operation timings of a driving motor, a pump, and an air operation valve in the case of generation of the delay in the discharging when the coating of a resist solution is carried out under the conventional control method and also showing a timing of the discharging of the resist solution.

However, the three resist coating process units (COT) are stacked one upon the other as described previously, and the resist solution is supplied in general to the resist solution discharging nozzles 90 of these units (COT) through a common pipe. As a result, the time to start the discharging of the resist solution from the resist solution discharging nozzle 90 from the transmission of the open signal from the controller 110 to the air operation valve is rendered nonuniform by the difference in head among the resist coating process units (COT) and by the individual variation of the pump or the air operation valve, with the result that the time to start the discharging of the resist solution from the time for the air operation valve to have been opened is retarded from the ideal state shown in FIG. 10, as shown in FIG. 11. The delay time Δt is increased in some cases such that the rotating speed of the wafer W is increased to reach about the maximum speed at the time when the discharging of the resist solution is actually started. If the resist solution is discharged under the high rotating speed of the wafer W, the thickness of the resist film is much deviated from the set value. Also, in this case, the actual discharging time $t_2'$ of the resist solution is rendered shorter than the time $t_2$ referred to previously by the time corresponding to the delay in the starting of the resist solution discharging. What should be noted is that the thickness of the resist film in the peripheral portion of the wafer W is decreased with increase in the delay time Δt and with shortening in the discharging time so as to render poor the uniformity in the thickness of the resist film.

In order to avoid the problems described above, the starting of the resist solution discharging is detected in the present invention by using the optical fiber sensor apparatus 100, and the resist coating process is controlled on the basis of the start timing of the resist solution discharging, which is calculated based on the detected signal, as described previously.

Figure 12:
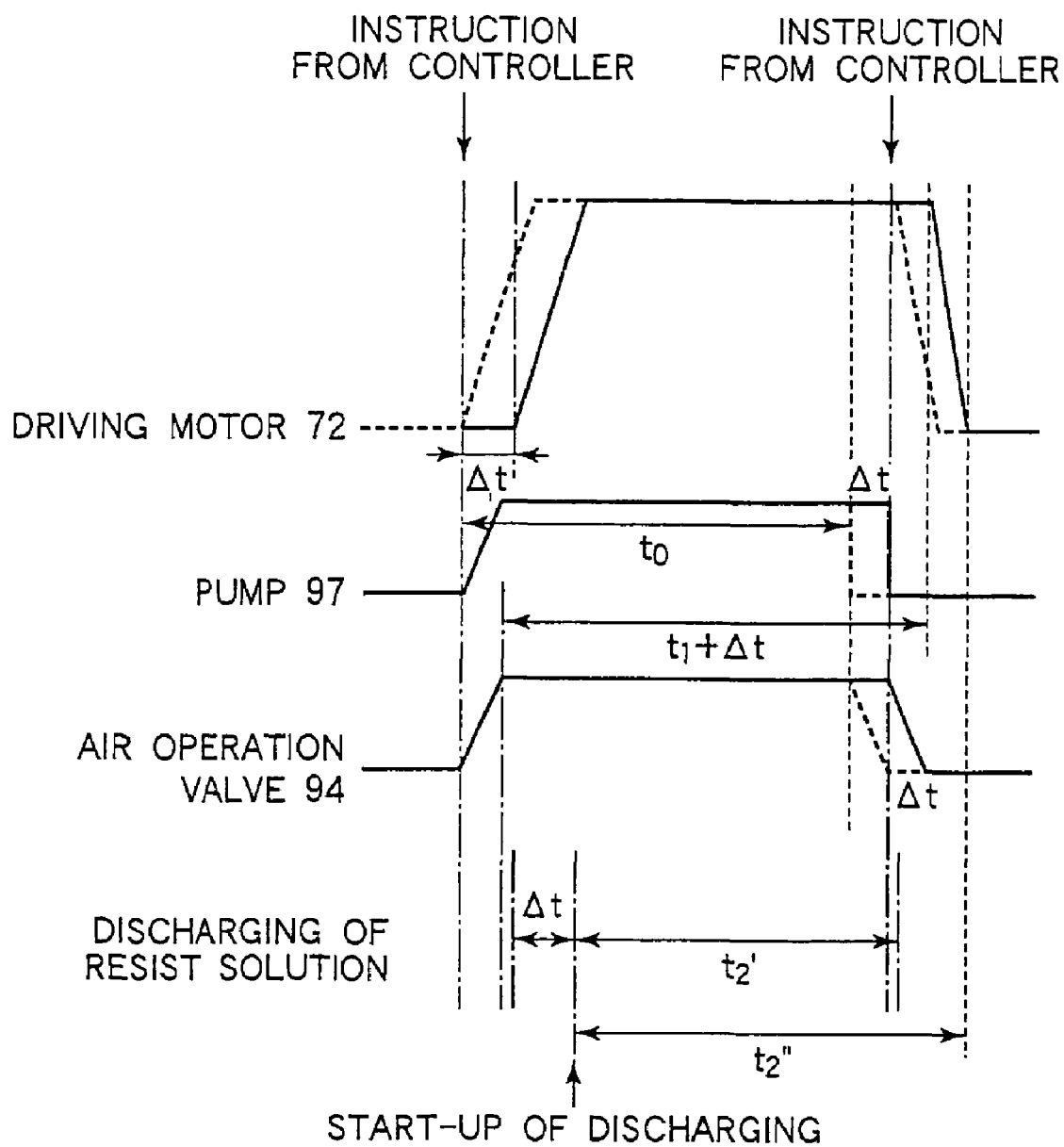
FIG. 12 is a graph showing the operation timings of a driving motor, a pump, and an air operation valve when the coating of a resist solution is carried out under the control method for the embodiment of the present invention and also showing a timing of the discharging of the resist solution.

To be more specific, the controller 110 controls at least one of the drive start timing of the driving motor 72 for rotating the spin chuck 71, the drive timing of the air operation valve 94, and the drive timing of the pump 97 on the basis of the start timing of the resist solution discharging, which is calculated from the signal detected by the optical fiber sensor apparatus 100. For example, as shown in FIG. 12, the start timing of the resist solution discharging is calculated on the basis of the signal detected by the optical fiber sensor apparatus 100, and the drive start timing of the driving motor 72 is retarded by the controller 110 based on the calculated value when the resist coating process of the next wafer is performed. Of course, it is possible to advance the drive start timing of the pump 97 and/or the timing of opening the air operation valve 94. Also, the controller 110 calculates the delay time Δt from the signal to start the resist solution discharging, and a control signal is transmitted to the pump 97 and the air operation valve 94 so as to extend the discharging time of the resist solution by the time corresponding to the delay time Δt, thereby making the actual discharging time $t_2''$ substantially equal to time $t_2$. Also, the timing to stop the driving motor 72 is controlled based on the actual discharging time of the resist solution.

As described above, the time when the resist solution began to be actually discharged from the resist solution discharging nozzle 90 is detected in the present invention, and the coating process of the resist solution is controlled on the basis of the detected signal. It follows that the various conditions can be controlled under the state that the time when the resist solution was actually discharged is grasped so as to make it possible to make up for the nonuniformity in the start timing of the resist solution discharging caused by, for example, the difference in the head of the resist solution discharging nozzle 90 and the individual variation of the pump 97 or the air operation valve 94.

To be more specific, the starting of the resist solution discharging from the resist solution discharging nozzle 90 is detected by the optical fiber sensor apparatus 100, and at least one of the drive start timing of the driving motor 72 for rotating the valve 94 and the drive timing of the pump 97 is controlled on the basis of the start timing of the resist solution discharging, which is calculated based on the signal detected by the optical fiber sensor apparatus 100. It follows that it is possible to prevent the difficulty that the resist film fails to have a prescribed thickness because the rotating speed of the wafer W is excessively high at the discharging time of the resist solution. It should also be noted that the delay time Δt between the time of transmitting an open signal to the air operation valve 94 based on the signal denoting the detection of start-up of the resist solution discharging and the time of actual discharging of the resist solution is calculated in the present invention, and the pump 97 and the air operation valve 94 are controlled based on the calculated delay time Δt so as to extend the discharging time of the resist solution to conform with the prescribed time. It follows that it is possible to render substantially constant the actual discharging time of the resist solution so as to further improve the uniformity in the thickness of the resist film. What should also be noted is that the stop timing of the driving motor 72 is also controlled on the basis of the delay time Δt so as to further improve the uniformity in the thickness of the resist film.

On the other hand, it is also possible for the time between the transmission of the close signal to the air operation valve 94 and the time when the discharging of the resist solution from the resist solution discharging nozzle 90 is actually stopped to be made nonuniform by various factors. If the time required for stopping the discharging of the resist solution is nonuniform, the actual discharging time is rendered nonuniform in practice even if the actual discharging time of the resist solution is controlled based on the signal to start the discharging of the resist solution as described above.

In such a case, it is detected by the optical fiber sensor apparatus 100 that the discharging of the resist solution has been stopped, and at least one of the drive stop timing of the pump 97, the operation timing of the air operation valve, and rotation stop timing of the driving motor 72 is controlled based on the signal detected by the optical fiber sensor apparatus 100. As a result, it is possible to improve markedly the nonuniformity of the actual discharging time. To be more specific, the controller 110 calculates the stop timing of the discharging of the resist solution based on a signal denoting the stop of the discharging, which is detected by the optical fiber sensor apparatus 100, and at least one of the drive stop timing of the pump 97, the operation timing of the air operation valve 94, and the rotation stop timing of the driving motor 72 is controlled so as to permit the discharging of the resist solution to be stopped at an appropriate timing based on the calculated value in performing the next process of coating the wafer with the resist solution.

It should be noted, however, that, in the case of the apparatus constructed as shown in FIG. 5, it is impossible to detect the stop of the discharging of the resist solution. Therefore, the detection of the stop of the discharging of the resist solution is limited to the case where th optical fiber sensor 100 is mounted as shown in FIGS. 7 and 8.

It is possible to control the start timing of the discharging of the resist solution and the actual discharging time with a high accuracy by the control method described above. Further, in the case of using the optical fiber sensor apparatus 100, a high precision in the film thickness and a high uniformity of the film thickness can be achieved by employing the techniques described below in addition to or separately from the control method described above.

In the first technique, the state in starting the discharging of the resist solution and/or the state in stopping the discharging is detected by the optical fiber sensor apparatus 100 so as to control the speed of opening and/or closing the air operation valve 94 to fall within an allowable range. To be more specific, if the air operation valve 94 is opened at an excessively high speed, the resist solution is, for example, once sucked and, then, discharged. On the other hand, if the air operation valve 94 is opened at an excessively low speed, a difficulty such as a liquid dripping is brought about. Also, if the air operation valve 94 is closed at an excessively high speed, the state in stopping the discharging of the resist solution is rendered unstable. On the other hand, if the air operation valve 94 is closed at an excessively low speed, a difficulty such as a liquid dripping is brought about. It follows that it is important to control in advance the speed of opening and/or closing the air operation valve so as to permit the state in starting the discharging of the resist solution and/or the state in stopping the discharging to fall within an allowable range.

Figure 13:
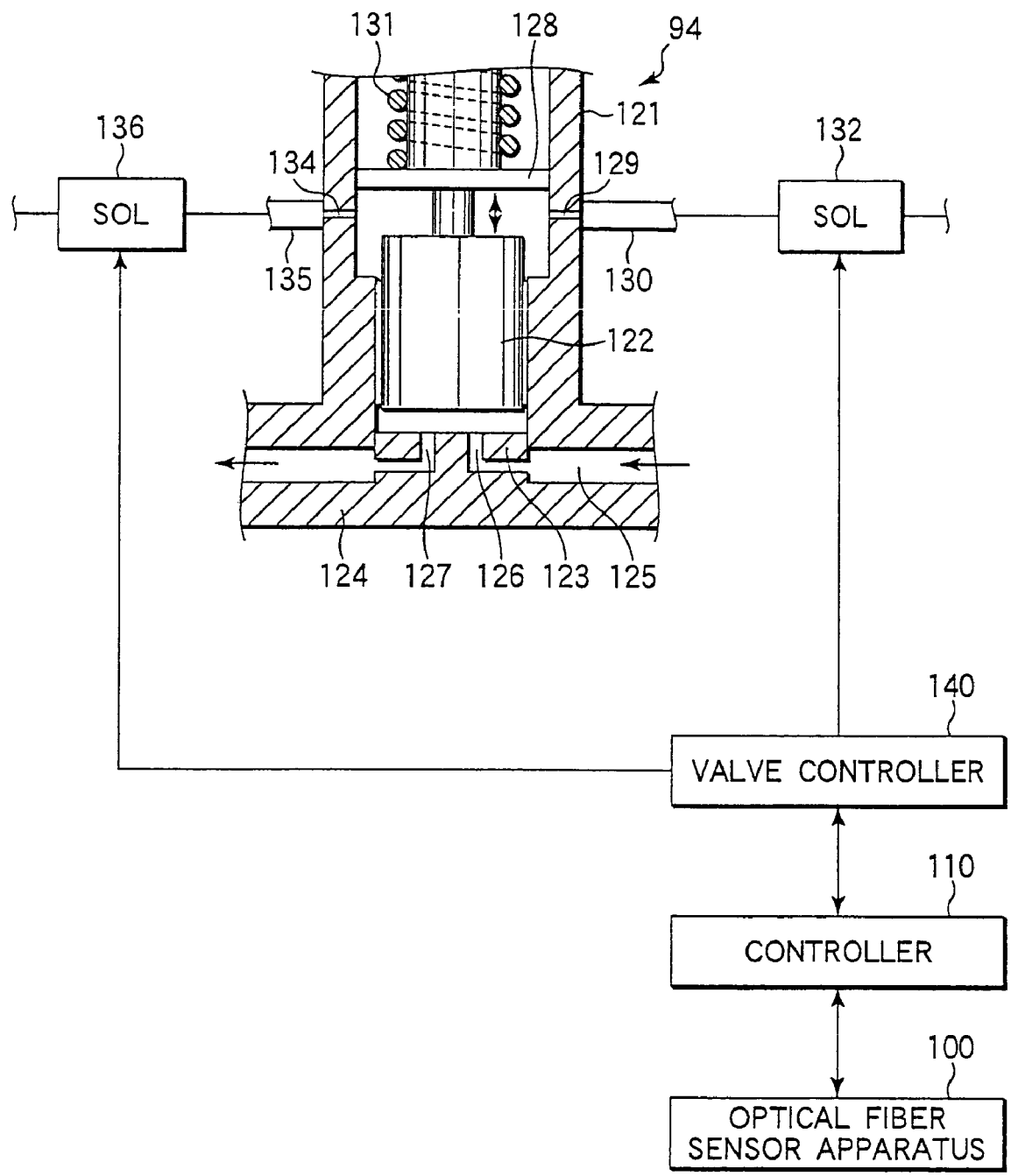
FIG. 13 is a block diagram for explaining the technique of performing the initial setting of an air operation valve by using an optical fiber sensor apparatus.

As shown in, for example, FIG. 13, the air operation valve 94 includes a container 121, a valve body 122 arranged movable in the vertical direction within the container 121, a valve seat 123 positioned below the valve body 122, and a resist solution flowing section 124. The resist solution flowing section 124 includes a resist solution passageway 125 connected to the resist solution supply pipe 91. A resist solution inlet port 126 and a resist solution outlet port 127 are open to the valve seat 123 from the resist solution passageway 125. Under the closed state that the valve body 122 abuts against the valve seat 123, the flow of the resist solution is shielded, and resist solution is allowed to flow under the open state that the valve body 122 is positioned apart from the valve seat 123. A partition member 128 for partitioning the inner space of the container 121 into an upper space and a lower space is arranged movable in the vertical direction, and the valve body 122 is formed integral with the partition member 128 in a manner to hang from the partition member 128. The air is introduced from an air introducing port 129 formed in the side wall of the container 121 into the container 121 through an air introducing pipe 130 so as to move upward the partition member 128. As a result, the valve body 122 is also moved upward so as to open the valve 94. The introduction of the air is performed by operating an inlet side solenoid valve 132 mounted to the air introducing pipe 130. Also, an air discharge port 134 is formed in the side wall of the container 121, and an air discharge pipe 135 is connected to the air discharge port 134. When the valve 94 is closed, the air supply is stopped and a discharge side solenoid valve 136 mounted to the air discharge pipe 135 is operated so as to discharge the air within the container 121. A coil spring 131 urging downward the partition member 128 is mounted within the contain 121 above the partition member 128. Since the valve 94 is of a normally closed structure that the air operation valve 94 is kept closed in the case where the air is not introduced into the container 121 and when the air is discharged as described above, the valve 94 is closed by discharging the air from within the container 121 through the air discharge pipe 135 after the air operation valve 94 is opened.

The inlet side solenoid valve 132 and the outlet side solenoid valve 136 are operated by operating a valve controller 140. On the other hand, the valve controller 140 is controlled by the controller 110 described previously. It follows that the opening speed and the closing speed of the air operation valve 94 are controlled by allowing the valve controller 140 to control the inlet side solenoid valve 132 and the outlet side solenoid valve 136, respectively, in response to the instruction given from the controller 110.

Where the opening speed of the air operation valve 94 is set initially, the air operation valve 94 is opened at various speeds so as to detect the initial state of the discharging of the resist solution by the optical fiber sensor apparatus 100, and the optimum opening speed is automatically selected from among the values falling within an allowable range. When the resist solution is actually discharged, the optimum opening speed thus selected used as the set value. This is also the case with the initial setting of the closing speed in the case of closing the air operation valve 94. Specifically, the air operation valve 94 is closed at various closing speeds, and the state in stopping the discharging of the resist solution is detected by the optical fiber sensor apparatus 100 so as to automatically select the optimum closing speed from among the values falling within an allowable range. When the resist solution is actually discharged, the optimum closing speed thus selected is used as the set value. In this fashion, the state at the initiation of the discharging of the resist solution and/or the state at the finishing time of discharging can be set in advance to fall within allowable ranges so as to make it possible to avoid the detrimental effects given by the state at the initiation of the discharging of the resist solution and/or the state at the finishing time of the discharging to the accuracy and the uniformity of the resist film thickness. In this case, the delay time between the transmission of a signal to the air operation valve 94 and actual initiation of the discharging of the resist solution and/or the actual finishing time of the discharging is dependent on the opening speed and/or the closing speed of the air operation valve 94. Therefore, after the opening speed and/or the closing speed of the air operation valve QA is set, the set value of the corresponding delay time is determined. Where the state in starting alone the discharging of the resist solution is made appropriate by the first technique, it is possible to use the optical fiber sensor apparatus 100 shown in any of FIGS. 5, 7 and 8. On the other hand, in the case of making appropriate the state in finishing the discharging, used is the optical fiber sensor apparatus 100 shown in FIG. 7 or 8.

The second technique will now be described.

Figure 14:
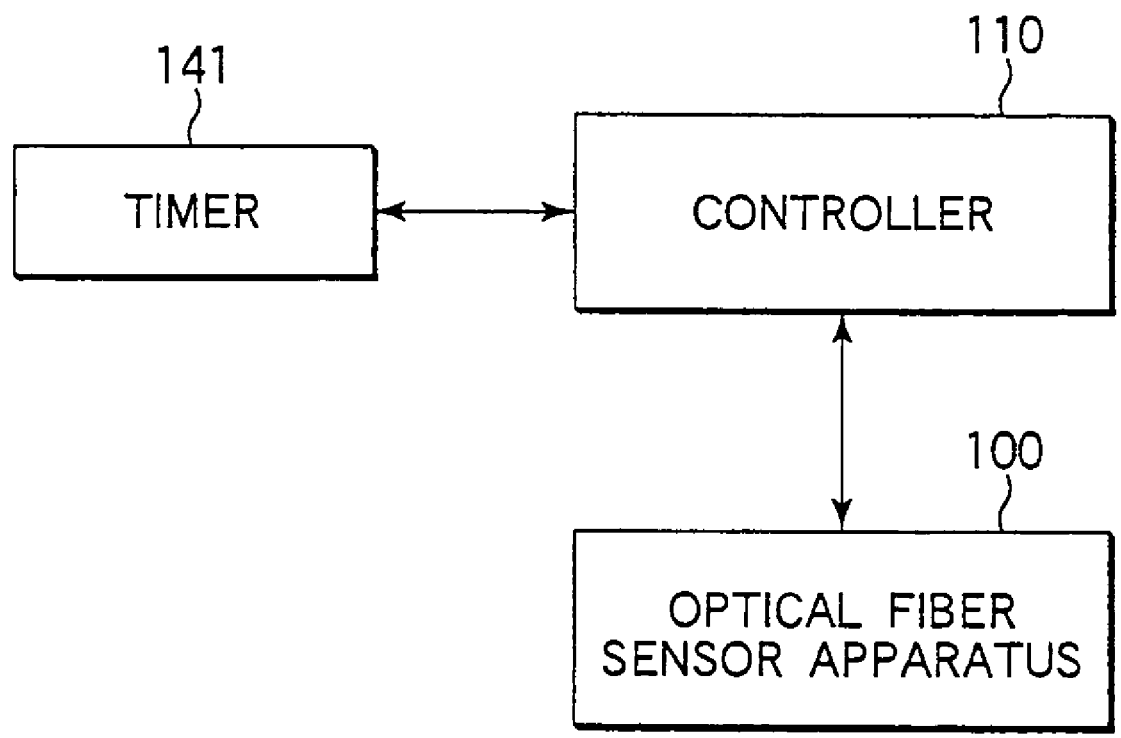
FIG. 14 is a block diagram for explaining the technique of grasping an abnormal discharging of the resist solution by using an optical fiber sensor apparatus.

The second technique is for grasping the abnormal discharging of the resist solution such as the situation that the supply of the resist solution becomes broken during the coating operation or the situation that discharging of the resist solution is not stopped at the stop timing. To be more specific, the actual discharging time during which the discharging of the resist solution is detected by the optical fiber sensor apparatus 100 is measured by a timer 141, and the actual discharging time thus measured is compared with the set time for the discharging of the resist solution, as shown in FIG. 14. It is judged that there is an abnormality in the case where there is a difference larger than an allowable value between the actual discharging time and the set time. As a result, it is possible to stop the coating process when there is an abnormal discharging of the resist solution so as to make it possible to avoid the detrimental effects given by the abnormal discharging of the resist solution to the accuracy and the uniformity of the resist film thickness. In the case of the second technique, it is necessary to grasp the state that the resist solution is being actually discharged. Therefore, the optical fiber sensor apparatus 100 is arranged as shown in FIG. 7 or 8.

A resist coating process unit (COT) according to another embodiment of the present invention will now be described with reference to FIG. 15.

Figure 15:
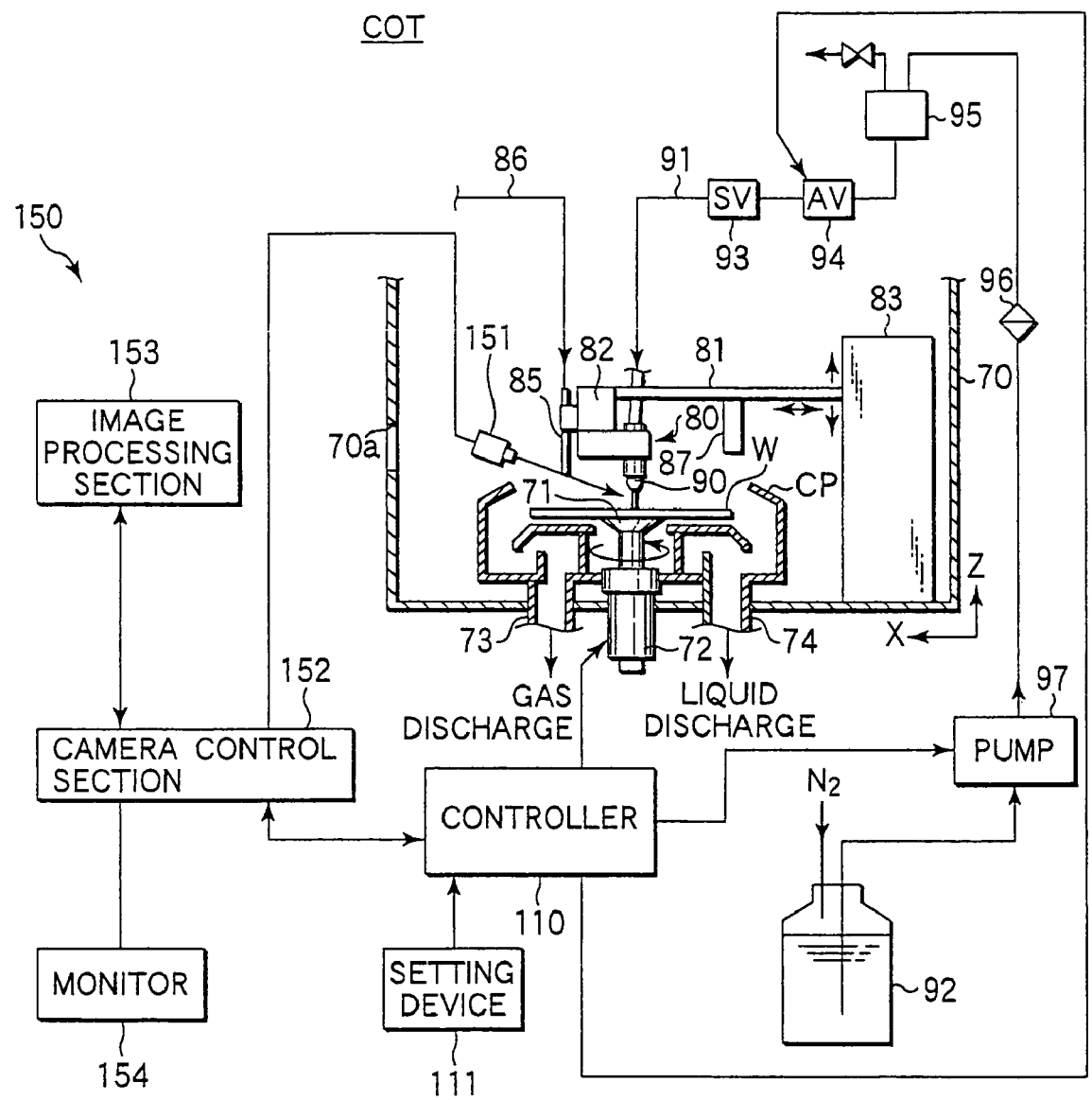
FIG. 15 is a cross sectional view showing the entire construction of a resist coating process unit according to another embodiment of the present invention.

The embodiment shown in FIG. 15 differs from the embodiment described above in that a CCD camera system 150 is used as the detecting apparatus in place of the optical fiber sensor apparatus 100 used in the embodiment described above.

As shown in FIG. 15, the CCD camera system 150 includes a CCD camera 151 for photographing the stream of the resist solution discharged from the resist solution discharging nozzle 90, a camera control section 152 for controlling the operation of the CCD camera 151 and for controlling the information, an image process section 153, and a monitor 154. The image photographed by the CCD camera 151 is transmitted to the image process section 153 via the camera control section 152 for application of a prescribed image processing to the photographed image. Then, the information on the image processing is transmitted to the camera control section 152, with the result that the initiation of the discharging of the resist solution and/or the finish of the discharging of the resist solution is grasped. Also, the image in this stage is displayed as required on the monitor 154. As a result, the actual initiation of the discharging of the resist solution and/or the actual finish of the discharging of the resist solution can be detected so as to make it possible to achieve the control similar to that achieved in the embodiment described previously. It follows that it is possible to prevent the inconveniences causing the fluctuation in the thickness of the film such as the situation that the target substrate to be processed is rotated at an excessively high speed at the discharging stage of the resist solution and the situation that the actual discharging time is short.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, each of the embodiments described above covers the case where an optical fiber sensor apparatus or a CCD camera system is used as the detecting apparatus for detecting the start or stop of the discharging of the resist solution. However, it is also possible to use an optical sensor other than the optical fiber sensor or another optical detecting apparatus. Also, each of the embodiments described above covers the case where a resist solution is used as the coating liquid. However, it is also possible to use a coating liquid for forming a film by a rotary coating process, i.e., for forming, for example, an antireflection film or an interlayer insulating film, and other coating liquids. Further, in each of the embodiments described above, a semiconductor wafer is used as the target substrate to be processed. However, it is also possible to use other target substrates such as an LCD substrate and a reticle substrate for a mask.

What is claimed is:

1. A coating process apparatus for performing a coating process to form a coating film by discharging a coating liquid onto a target substrate while rotating the target substrate so as to expand the coating liquid radially outward on the target substrate, the coating process apparatus comprising:
    (a) a plurality of coating process units disposed at different heights each for performing the coating process, each of the coating process units includes
    a substrate holding member configured to hold a target substrate in a substantially horizontal state,
    a motor configured to rotate the substrate holding member,
    a coating liquid discharge nozzle configured to discharge a coating liquid onto the target substrate held by the substrate holding member, and
    a detecting device configured to optically detect discharge of the coating liquid from the coating liquid discharge nozzle;
    (b) coating liquid supply mechanisms respectively connected to the coating process units, each of the coating liquid supply mechanisms includes
    a pump connected to the coating liquid discharge nozzle through a supply line and configured to cause the coating liquid to be discharged from the coating liquid discharge nozzle, and
    a valve provided on the supply line and configured to open and close the supply line; and
    (c) a controller configured to control an operation of the coating process apparatus and preset to use a detection signal of the detecting device to calculate a discharge start delay, which is a delay of a start of coating liquid discharge from the coating liquid discharge nozzle relative to a start of coating liquid supply determined by an operation of at least one of the pump and the valve, and to use the discharge start delay to correlatively control the motor, the pump, and the valve, so as to remove variations in a matching time interval among the plurality of coating process units, wherein the matching time interval is an interval between a drive start time point of the motor to rotate the substrate holding member and a discharge start time point of the coating liquid from the coating liquid discharge nozzle, in the coating process.

2. The coating process apparatus according to claim 1, wherein the controller is preset to use the discharge start delay to correlatively control the pump and the valve, so as to remove variations in a period of coating liquid discharge to the target substrate among the plurality of coating process units, in the coating process.

3. The coating process apparatus according to claim 2, wherein the controller is preset to use a detection signal of the detecting device to calculate a discharge end delay, which is a delay of an end of coating liquid discharge from the coating liquid discharge nozzle relative to an end of coating liquid supply determined by an operation of at least one of the pump and the valve, and to use the discharge end delay to set a timing of at least one of stopping the pump and closing the valve in the coating process.

4. The coating process apparatus according to claim 3, wherein the controller is preset to set a timing of stopping the motor rotating the substrate holding member, correlatively with the timing of at least one of stopping the pump and closing the valve.

5. The coating process apparatus according to claim 1, further comprising a timer configured to measure an actual discharge time during which the detecting device detects discharge of the coating liquid from the coating liquid discharge nozzle.

6. The coating process apparatus according to claim 5, wherein the controller is preset to compare the actual discharge time with a set time of coating liquid discharge, and to judge that there is an abnormality in a case where a difference between the actual discharge time and the set time is not smaller than an allowable value.

7. The coating process apparatus according to claim 1, wherein the detecting device includes an optical sensor.

8. The coating process apparatus according to claim 7, wherein the optical sensor includes an optical fiber sensor for projecting light and an optical fiber sensor for receiving light.

9. The coating process apparatus according to claim 1, wherein the detecting device includes a CCD camera.

10. The coating process apparatus according to claim 1, wherein the detecting device is disposed above the substrate holding member.

11. The coating process apparatus according to claim 1, wherein the detecting device is disposed at a position prepared for the coating liquid discharge nozzle to retreat and perform dummy dispense, outside the substrate holding member.

12. The coating process apparatus according to claim 1, wherein the coating process units are stacked each other in a vertical direction.

13. The coating process apparatus according to claim 1, wherein the coating liquid supply mechanisms is configured to supply a resist liquid as the coating liquid.

14. A resist coating process apparatus, used in photolithography, for performing a coating process to form a resist film by discharging a resist liquid onto a target substrate while rotating the target substrate so as to expand the resist liquid radially outward on the target substrate, the resist coating process apparatus comprising:

(a) a plurality of coating process units stacked each other in a vertical direction each for performing the coating process, each of the coating process units includes
a substrate holding member configured to hold a target substrate in a substantially horizontal state,
a motor configured to rotate the substrate holding member,
a resist liquid discharge nozzle configured to discharge a resist liquid onto the target substrate held by the substrate holding member, and
a detecting device configured to optically detect discharge of the resist liquid from the resist liquid discharge nozzle;

(b) resist liquid supply mechanisms respectively connected to the coating process units, each of the resist liquid supply mechanisms includes
a pump connected to the resist liquid discharge nozzle through a supply line and configured to cause the resist liquid to be discharged from the resist liquid discharge nozzle, and
a valve provided on the supply line and configured to open and close the supply line; and (c) a controller configured to control an operation of the resist coating process apparatus and preset to use detection signals of the detecting device to calculate a discharge start delay and a discharge end delay, which are respective delays of a start and an end of resist liquid discharge from the resist liquid discharge nozzle relative to a start and an end of resist liquid supply determined by operations of at least one of the pump and the valve, and to use the discharge start delay and the discharge end delay to correlatively control the motor, the pump, and the valve, so as to remove variations in a matching time interval and in a period of resist liquid discharge to the target substrate among the plurality of coating process units, wherein the matching time interval is an interval between a drive start time point of the motor to rotate the substrate holding member and a discharge start time point of the resist liquid from the resist liquid discharge nozzle, in the coating process.

15. The resist coating process apparatus according to claim 14, wherein the controller is preset to use the discharge end delay to set a timing of at least one of stopping the pump and closing the valve in the coating process.

16. The resist coating process apparatus according to claim 15, wherein the controller is preset to set a timing of stopping the motor rotating the substrate holding member, correlatively with the timing of at least one of stopping the pump and closing the valve.

17. The resist coating process apparatus according to claim 14, further comprising a timer configured to measure an actual discharge time during which the detecting device detects discharge of the resist liquid from the resist liquid discharge nozzle.

18. The resist coating process apparatus according to claim 17, wherein the controller is preset to compare the actual discharge time with a set time of resist liquid discharge, and to judge that there is an abnormality in a case where a difference between the actual discharge time and the set time is not smaller than an allowable value.

19. The resist coating process apparatus according to claim 14, wherein the detecting device is disposed above the substrate holding member.

20. The resist coating process apparatus according to claim 14, wherein the detecting device is disposed at a position prepared for the resist liquid discharge nozzle to retreat and perform dummy dispense, outside the substrate holding member.

* * * * *